(12) United States Patent
Pyeon

(10) Patent No.: US 9,123,402 B2
(45) Date of Patent: Sep. 1, 2015

(54) DYNAMIC RANDOM ACCESS MEMORY AND BOOSTED VOLTAGE PRODUCER THEREFOR

(71) Applicant: CONVERSANT INTELLECTUAL PROPERTY MANAGEMENT INC., Ottawa (CA)

(72) Inventor: Hong Beom Pyeon, Ottawa (CA)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 14/324,265

(22) Filed: Jul. 7, 2014

(65) Prior Publication Data

US 2014/0321226 A1    Oct. 30, 2014

Related U.S. Application Data

(60) Division of application No. 13/973,574, filed on Aug. 22, 2013, which is a continuation of application No. 13/305,064, filed on Nov. 28, 2011, now Pat. No. 8,526,260, which is a division of application No. 11/855,496, filed on Sep. 14, 2007, now Pat. No. 8,072,256.

(51) Int. Cl.
| | |
|---|---|
| *G11C 7/00* | (2006.01) |
| *G11C 5/14* | (2006.01) |
| *G11C 11/406* | (2006.01) |
| *G11C 11/4074* | (2006.01) |
| *H02M 3/07* | (2006.01) |

(52) U.S. Cl.
CPC .............. *G11C 5/145* (2013.01); *G11C 11/406* (2013.01); *G11C 11/4074* (2013.01); *H02M 3/073* (2013.01); *G11C 2211/4061* (2013.01); *G11C 2211/4067* (2013.01); *G11C 2211/4068* (2013.01); *H02M 2003/077* (2013.01)

(58) Field of Classification Search
None
See application file for complete search history.

(56) References Cited

U.S. PATENT DOCUMENTS

| | | | | |
|---|---|---|---|---|
| 5,867,442 | A | * | 2/1999 | Kim et al. ...................... 365/226 |
| 5,973,895 | A | * | 10/1999 | Ternullo et al. .................. 361/18 |
| 5,986,935 | A | * | 11/1999 | Iyama et al. ............. 365/185.18 |
| 6,563,746 | B2 | * | 5/2003 | Fujioka et al. ........... 365/189.09 |
| 7,274,248 | B2 | * | 9/2007 | Okamoto ...................... 327/536 |

FOREIGN PATENT DOCUMENTS

| | | |
|---|---|---|
| KR | 10-0172404 | 3/1999 |
| KR | 100195974 | 6/1999 |
| KR | 10-0771810 | 10/2007 |

* cited by examiner

*Primary Examiner* — Kretelia Graham
(74) *Attorney, Agent, or Firm* — Daniel Hammond

(57) ABSTRACT

A dynamic random access memory (DRAM) is selectively operable in a sleep mode and another mode. The DRAM has data storage cells that are refreshed in the refresh mode. A boosted voltage is provided for the operation of the DRAM. A boosted voltage provider includes a group of charge pump circuits that are selectively activated by a pump control circuit based on a refresh time for refreshing data in the DRAM cells in the sleep mode.

10 Claims, 16 Drawing Sheets

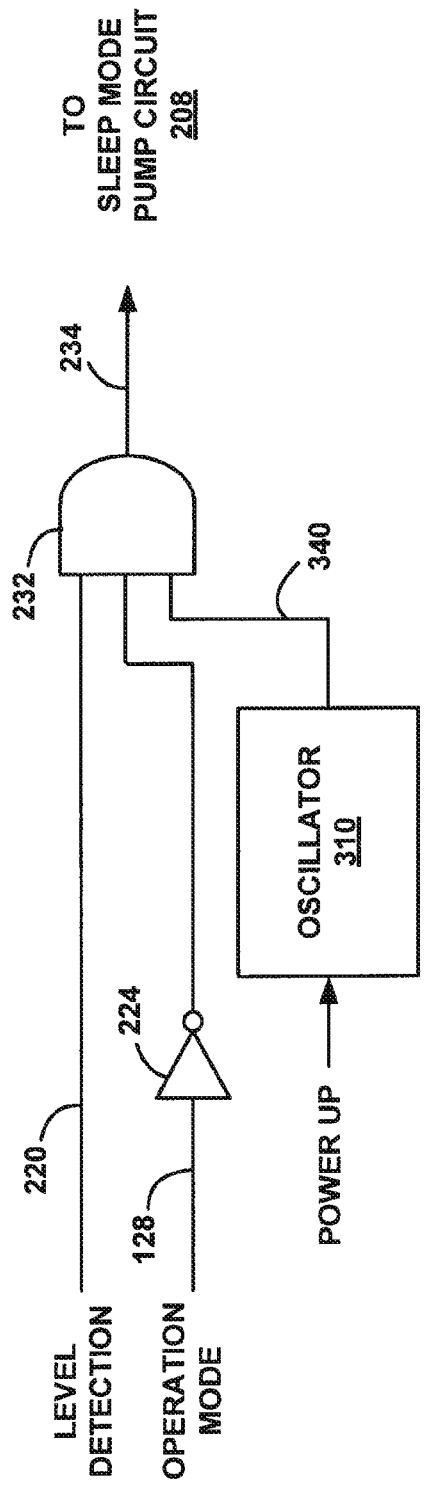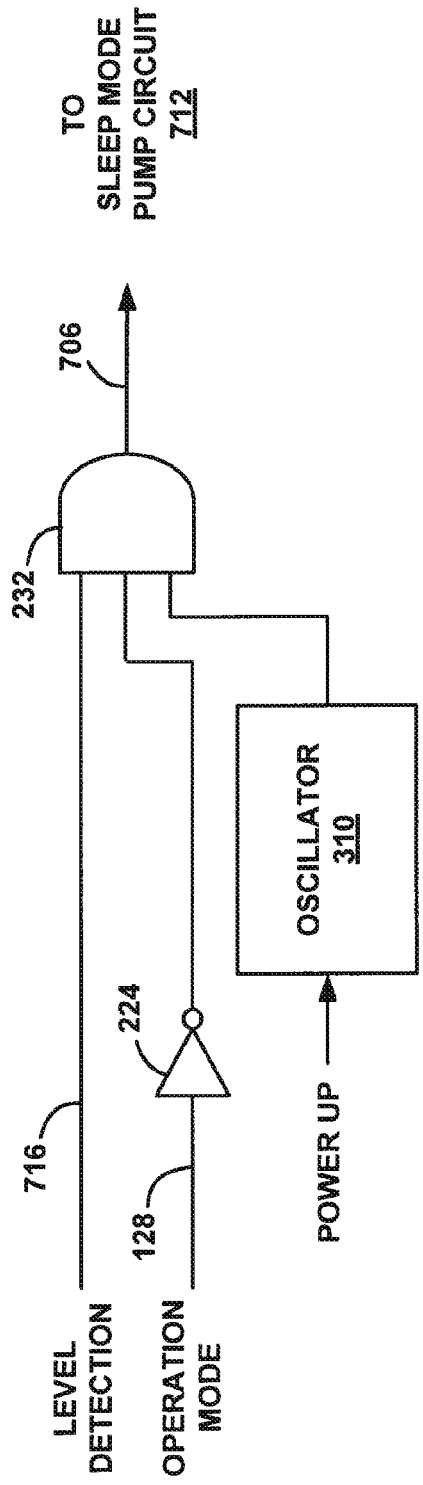

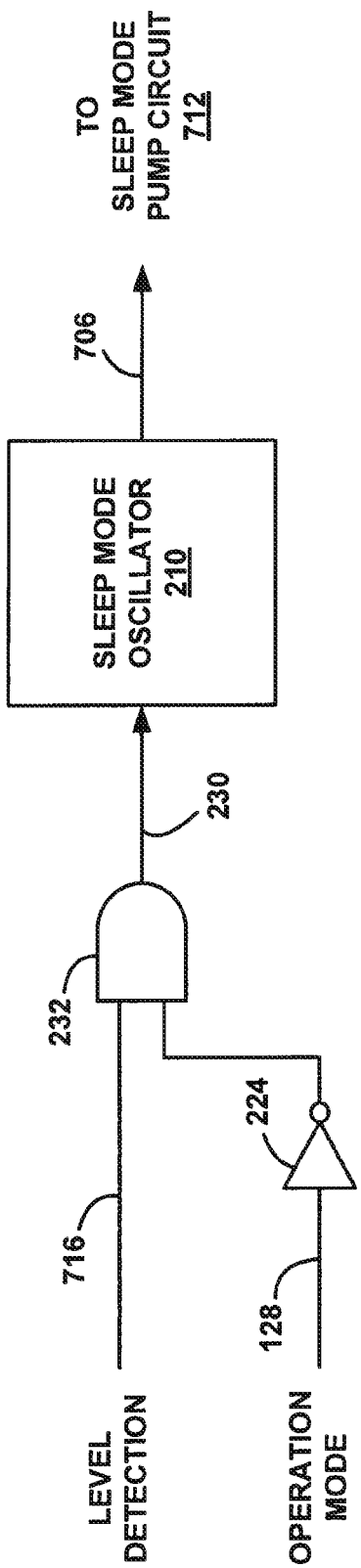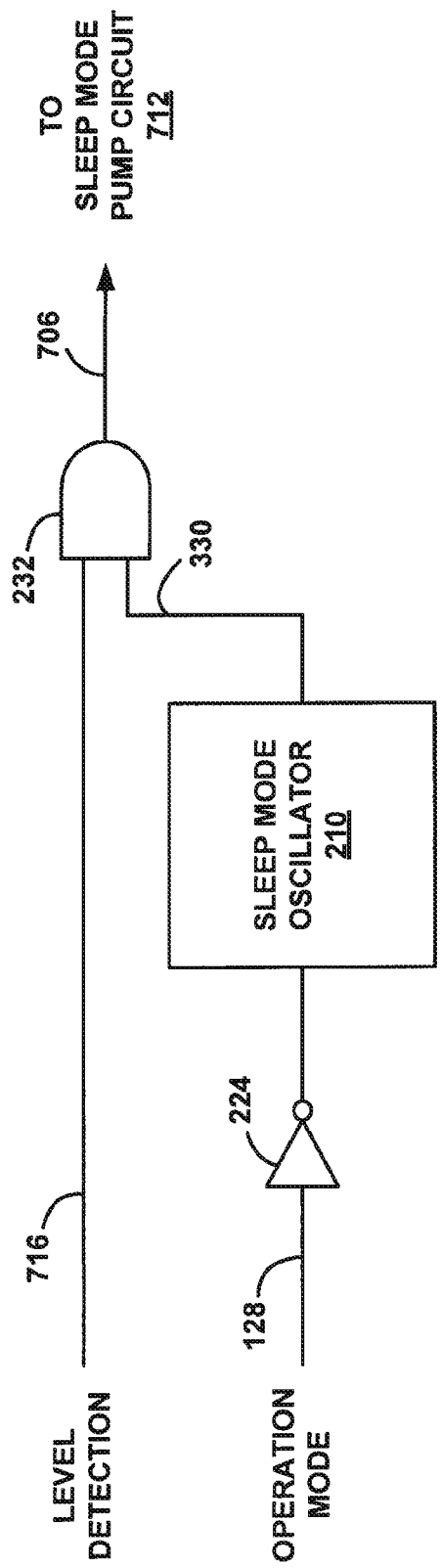

DYNAMIC RANDOM ACCESS MEMORY AND BOOSTED VOLTAGE PRODUCER THEREFOR

CROSS REFERENCE TO RELATED APPLICATIONS

This application is a divisional of U.S. patent application Ser. No. 13/973,574 filed Aug. 22, 2013, which is a continuation of U.S. patent application Ser. No. 13/305,064, filed Nov. 28, 2011, now issued as U.S. Pat. No. 8,526,260, which is a divisional of U.S. patent application Ser. No. 11/855,496, filed Sep. 14, 2007, now issued as U.S. Pat. No. 8,072,256, all of which are herein incorporated by reference.

FIELD OF THE INVENTION

The present invention relates generally to a semiconductor device and in particular to a boosted voltage producer with charge pump and a dynamic random access memory using it.

BACKGROUND OF THE INVENTION

Semiconductor memory devices, such as, for example, dynamic random access memory (DRAM) store data in an array of cells with each cell storing one bit of data. The cell arrays are typically arranged in rows and columns such that a particular cell is addressed by specifying its row and column within the array. Cells in a row are connected together to a wordline and cells in a column are connected together to a bitline. Sense amplifiers connected to the detect data in the cells. Each of DRAM cells includes a storage capacitor. As such, the cells are considered "dynamic", since the stored data (i.e., charged capacitor) will dissipate after a relatively short period of time. In order to retain the stored data, the contents of the DRAM cells are refreshed on a periodic basis by reapplying the charged state of the storage capacitor of each cell in a repetitive manner. A refresh operation is similar to a read operation in that the data in the cells is sensed by the sense amplifiers and the data is rewritten to the cells. Thus, the data is "refreshed" in the cells. The refresh operation is performed by enabling a wordline according to a row address and enabling a sense amplifier. Refresh operations can be either "auto-refresh" performed when the DRAM is in an active mode or "self-refresh" performed when the DRAM is in a sleep mode.

A boost required for getting from an external supply voltage (Vdd) to a gate voltage of access transistor sufficient to charge the capacitors of the cells changes with various characteristics of the DRAM. For example, the amount of current boost required overcoming the voltage dropping when a refresh operation occurs in the sleep mode increases with decreasing refresh time. An internal voltage supply is typically configured without regard to variable refresh times, often relying on a consideration of only the worst possible refresh times. The refresh rate of the DRAM is typically set by the manufacturer to a time period that ensures that data will not be lost. However, this time period may be more frequent than necessary and it may be desirable to reduce this frequency in order to reduce power consumption. The maximum driving capacity of an internal voltage supply is typically determined according to the worst refresh characteristics (i.e., the shortest time period). It, thus, provides more current than is required and results in greater power consumption.

For example, DRAMs in the 0.13 μm to 0.18 μm size range typically have longer refresh time periods (e.g., over 8 ms) and as such the sleep mode current requirements are low. As the size of DRAMs decreases to around 90 nm, MIM (metal-insulator-metal) type capacitors having shorter and more variable refresh time periods are used. A self-refresh pump circuit may not easily handle this variability in the voltage boost and current to be produced. Therefore, the refresh time period may be set according to the shortest possible period. If the DRAM has a higher refresh time period, then it may result in over-pumping and inefficient power use in the sleep mode.

SUMMARY OF THE INVENTION

In accordance with an aspect of the present invention, there is provided an apparatus for producing a boosted voltage, comprising: a plurality of charge pump circuitry operative with an input voltage and responsive to a charge pump signal and respective control signals, each of the plurality of charge pump circuitry including a capacitive element. In the apparatus, when charge pump circuitry is activated in response to a respective control signal, the capacitive element of the activated charge pump circuitry is charged in response to at least one of the input voltage and the charge pump signal, the charges of the activated charge pump circuitry contributing to provide the boosted voltage.

For example, each of the plurality of charge pump circuitry is individually activatable in response to the respective control signal. By an additional charge pump controller, the control signals may be provided to the respective charge pump circuitry according to information on a charge pump. According to the charge pump controller, charge pump circuitry to be activated is designated.

In accordance with a second aspect of the present invention, there is provided a method for producing a boosted voltage, comprising: providing a charge pump signal to a plurality of charge pump circuitry, each including a capacitive element; providing respective control signals to the plurality of charge pump circuitry; and activating charge pump circuitry by the respective control signal, so that the capacitive element of the activated charge pump circuitry is charged; thereby producing the boosted voltage with the charges of the activated charge pump circuitry.

For example, the step of activating comprises: activating each of the plurality of charge pump circuitry individually in response to the respective control signal. The step of providing respective control signals comprises: providing information for performing the charge pump; and providing the control signal based on the information.

In accordance with another aspect of the present invention, there is provided a dynamic random access memory (DRAM) having storage cells, the data of which is refreshed in a sleep mode, the DRAM comprising: a voltage provider for providing an output voltage to be used for operation of the DRAM; a determiner for determining whether the output voltage reaches a predetermined level to provide a determination result; and a controller for providing a control output in response to a refresh time in the sleep mode, the voltage provider providing a boosted voltage as the output voltage in response to the determination result and the control output.

For example, the voltage provider comprises: boost circuitry for providing the boosted voltage in response to the control output, the boost circuitry including a plurality of boost operation segments, each of the boost operation segments being individually activatable in response to the control output.

The controller may comprise: a segment selector for providing the control output to select a set of the plurality of boost operation segments to be activated according to the refresh time, the boosted outputs from the set of the selected boost operation segments being combinable to produce a combined output as the output voltage from the voltage provider.

In accordance with another aspect of the present invention, there is provided an apparatus for supplying an operation voltage to a dynamic random access memory (DRAM) including storage cells, the data of which is refreshed in a sleep mode of the DRAM, the apparatus comprising: first and second voltage suppliers for supplying a word bootstrapping voltage and a substrate bias voltage for use in the DRAM, the word bootstrapping voltage and the substrate bias voltage being varied in response to a refresh time in the sleep mode.

For example, the first voltage supplier comprises: a first voltage provider for providing a first output voltage to be used for operation of the DRAM; and a first determiner for determining whether the first output voltage reaches a first predetermined level to provide a first determination result.

The second voltage supplier may comprise: a second voltage provider for providing a second output voltage to be used for operation of the DRAM; and a second determiner for determining whether the second output voltage reaches a second predetermined level to provide a second determination result.

In accordance with another aspect of the present invention, there is provided a method for producing a boosted voltage for a dynamic random access memory (DRAM) having storage cells, the data of which is refreshed in a sleep mode, the method comprising: providing an output voltage to be used for operation of the DRAM; determining whether the output voltage reaches a predetermined level to provide a determination result; and providing a control output in response to a refresh time in the sleep mode, thereby providing a boosted voltage as the output voltage in response to the determination result and the control output.

In accordance with another aspect of the present invention, there is provided a method for supplying an operation voltage to a dynamic random access memory (DRAM) including storage cells, the data of which is refreshed in a sleep mode of the RAM, the method comprising: supplying a word bootstrapping voltage; and supplying a substrate bias voltage for use in the DRAM, the word bootstrapping voltage and the substrate bias voltage being varied in response to a refresh time in the sleep mode.

For example, the step of supplying a word bootstrapping voltage comprises: providing an output voltage to be used for operation of the DRAM; determining whether the output voltage reaches a predetermined level to provide a determination result; and providing a control output in response to a refresh time in the sleep mode, thereby providing a boosted voltage as the output voltage in response to the determination result and the control output.

The step of supplying a substrate bias voltage may comprise: providing an output voltage, the output voltage being used for operation of the DRAM; determining whether the output voltage reaches a predetermined level to provide a determination result; and providing a control output in response to a refresh time in the sleep mode, thereby providing a boosted voltage as the output voltage in response to the determination result and the control output.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 10 is a block diagram illustrating another example of a pump signal provider shown in FIG. 3;

FIG. 12 is a block diagram illustrating an example of a pump signal provider shown in FIG. 11;

FIG. 15 is a block diagram illustrating another example of a pump signal provider shown in FIG. 11;

FIG. 17 is a block diagram illustrating another example of a pump signal provider shown in FIG. 11;

DETAILED DESCRIPTION

In the following detailed description of sample embodiments, reference is made to the accompanying drawings, which form a part hereof and in which is shown by way of illustration specific sample embodiments. These embodiments are described in sufficient detail to enable those skilled in the art to practice the present invention and it is to be understood that other embodiments may be used and that logical, mechanical, electrical and other changes may be made without departing from the scope of the present invention. Therefore, the following detailed description is not to be taken in a limiting sense.

Generally, the present invention provides a boosted voltage producer with charge pump circuitry.

Figure 1:
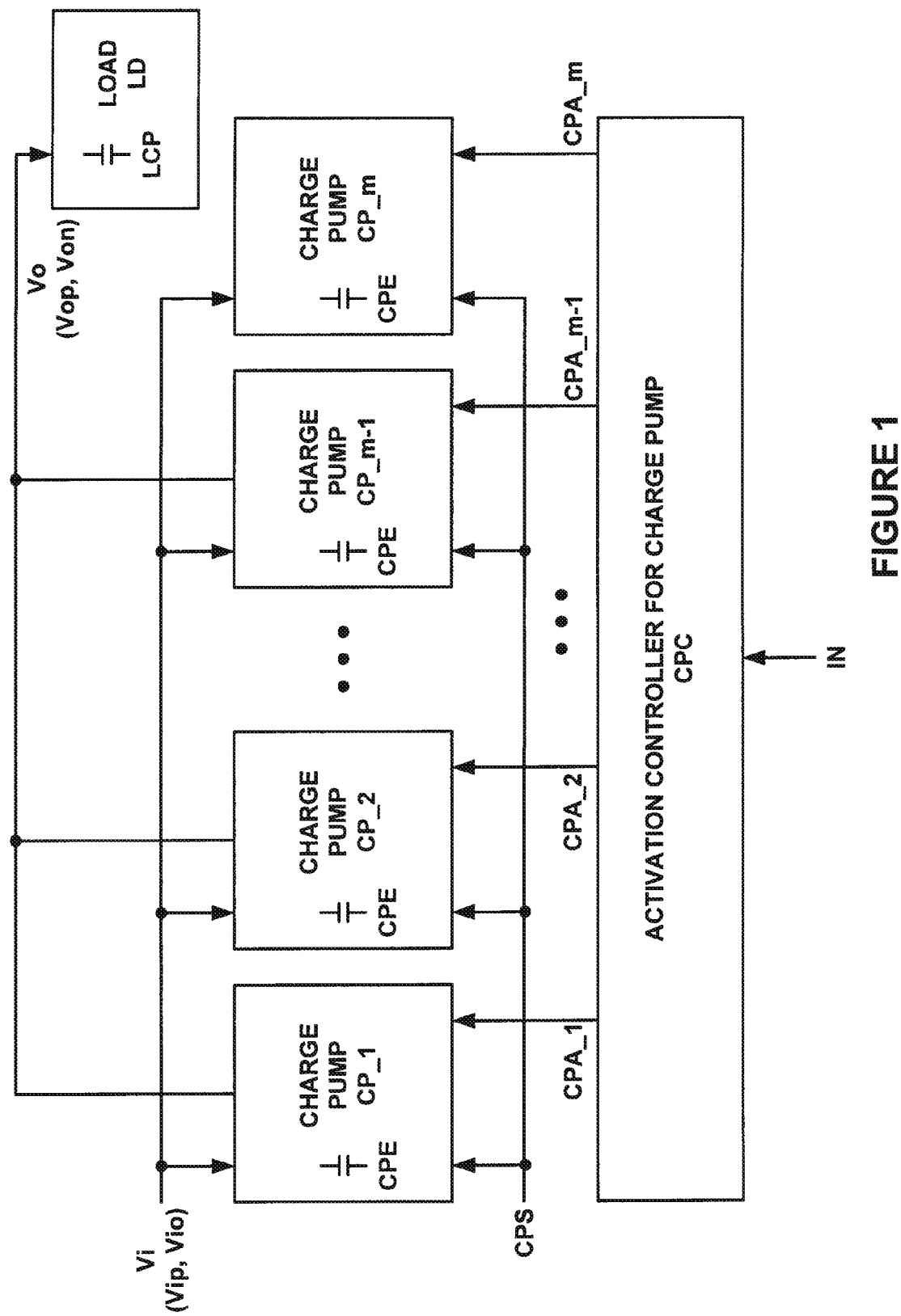
FIG. 1 is a block diagram illustrating a configuration of producing a boosted voltage according to an embodiment of the present invention.

FIG. 1 shows a configuration of producing a boosted voltage according to an embodiment of the present invention.

Referring to FIG. 1, a boosted voltage producer includes a group of charge pump circuitry CP_1, CP_2, ..., CP_m−1 and CP_m, m being an integer greater than one. Each of the charge pump circuitry CP_1, CP_2, ..., CP_m−1 and CP_m includes a capacitive element CPE therein and receives an input voltage Vi. Also, the boosted voltage producer includes an activation controller CPC for a charge pump. The activation controller CPC provides a group of charge pump activation signals CPA_1, CPA_2, ..., CPA_m−1 and CPA_m to charge pump circuitry CP_1, CP_2, ..., CP_m−1 and CP_m, respectively, in response to an input signal IN containing information on charge pump. Each of the charge pump circuitry CP_1, CP_2, ..., CP_m−1 and CP_m receives a pump signal CPS that is a repetition signal having two levels of "high" and "low", such as an oscillation signal provided from an oscillator (not shown).

In response to the respective one of the charge pump activation signals CPA_1, CPA_2, ..., CPA_m−1 and CPA_m, the charge pump circuitry is activated. The activated charge pump circuitry performs the voltage boost function and current pumping, in response to the pump signal CPS.

The boosted voltage producer provides a boosted output voltage Vo to a load LD, such as, for example, a semiconductor device and memory circuitry, which has a capacitive element LCP. The boosted voltage may be positive or negative. In the cases of producing a positive voltage Vop and a negative voltage Von, the input voltage Vi is a positive voltage Vip and a zero voltage Vio, respectively.

In the producer of a positive boosted voltage Vop, the capacitive element CPE in each of the activated charge pump circuitry is charged by the input voltage Vip in response to the pump signal CPS having a one level (e.g., "low"). When the pump signal CPS is in the other level (e.g., "high"), the charged voltage level at each of the activated charge pump circuitry is boosted and the charge of the capacitive element CPE is shared with the capacitive element LCP of the load LD. Therefore, current flows from the activated charge pump circuitry to the load LD. As a result, combined charges of all capacitive elements CPE in the activated charge pump circuitry contribute a production of the positive boosted output voltage Vop and current pumping from the charge pump circuitry CP_1, CP_2, ..., CP_m−1 and CP_m.

In the producer of a negative boosted voltage Von, in response to the pump signal CPS having a one level (e.g., "high"), the capacitive element CPE in each of the activated charge pump circuitry is charged by the "high" level voltage. When the pump signal CPS is in the other level (e.g., "low"), the charge of the capacitive element CPE is shared with the capacitive element LCP of the load LD. As a result, combined charges of all capacitive elements CPE in the activated charge pump circuitry contribute a production of the negative boosted output voltage Von and current pumping from the charge pump circuitry CP_1, CP_2, ..., CP_m−1 and CP_m.

With the information contained in the input signal IN, the charge pump activation controller CPC determines which charge pump circuitry are activated. In the case where each of the charge pump circuitry CP_1, CP_2, ..., CP_m−1 and CP_m is capable of providing the same amount of charge, the combined charge is proportional to the number of the activated charge pump circuitry.

Such a boosted voltage producer as shown in FIG. 1 is applicable to semiconductor devices, such as, for example, random access memories (DRAMs). Examples of DRAMs to which boosted voltage producers are applied will be described.

Figure 2:
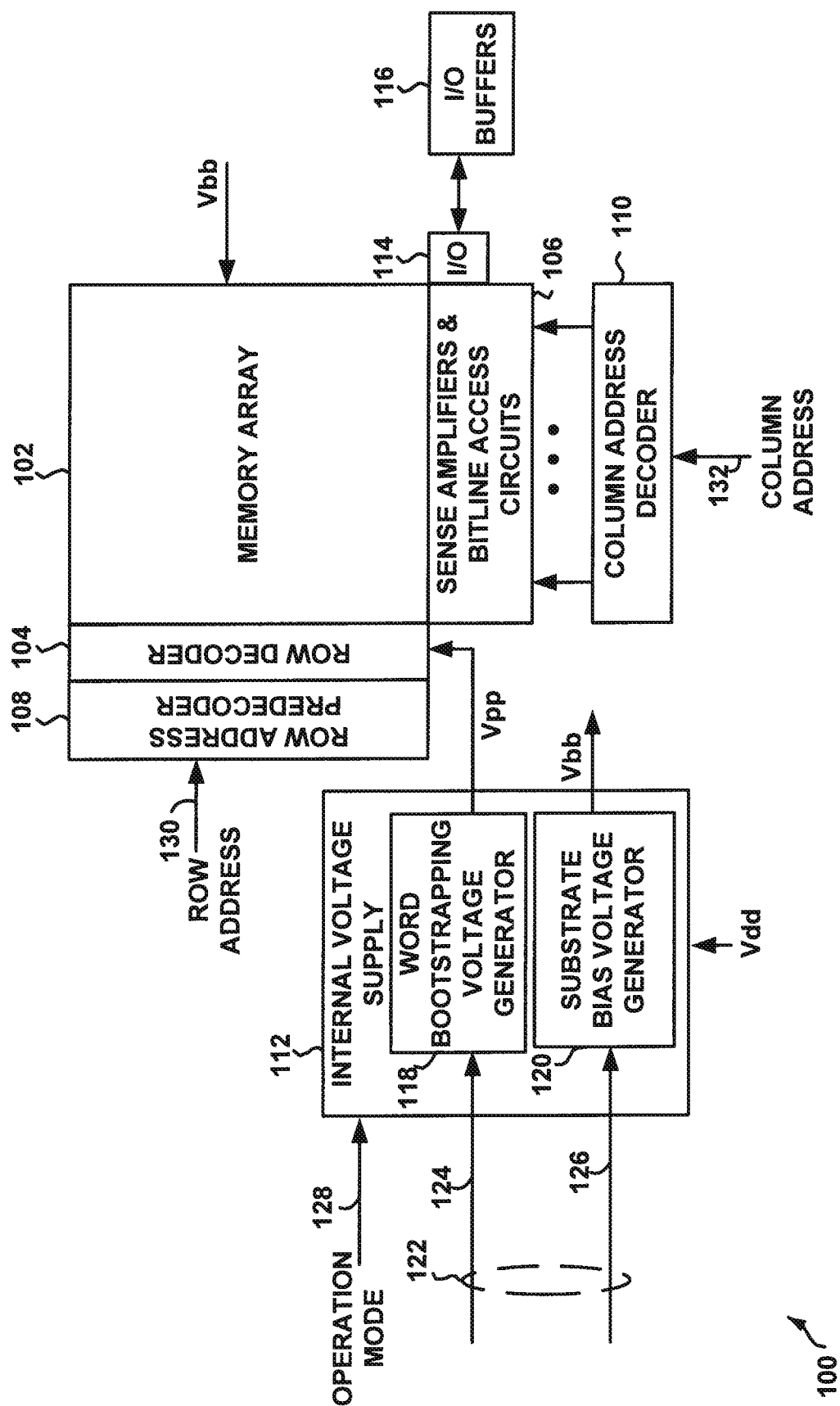
FIG. 2 is a block diagram illustrating a dynamic random access memory (DRAM) according to another embodiment of the present invention.

FIG. 2 shows an example of a dynamic random access memory (DRAM) according to another embodiment of the present invention. Referring to FIG. 2, a DRAM 100 stores data in an array of cells with each cell storing one bit. The DRAM 100 includes a memory array 102 that is an array of cells in which cells in a row are connected together by a wordline and in a column by a bitline. The wordlines and bitlines are used to access a specific cell. Each of the cells includes, for example, a storage capacitor (not shown) for storing data. The cells are considered to be "dynamic" since the stored data (i.e., charge of a capacitor) will dissipate after a relatively short period of time. In order to retain the stored data, the contents of the DRAM cells are refreshed on a periodic basis by reapplying the charged state to the storage capacitors. The maximum allowable time between refresh operations is determined by charge storage capabilities of the storage capacitors. A refresh time is typically set to guarantee data retention in the cells.

A refresh operation is similar to a read operation but without any output of data. The data in the cells is sensed by the sense amplifiers before a refresh operation that results in data being rewritten to the cells to refresh the data. The refresh operation is performed by enabling a wordline according to a row address and enabling a sense amplifier. Refresh operations can be either "auto-refresh" or "self-refresh." With an auto-refresh operation a refresh command is periodically generated during operation of the DRAM 100 and all other commands are interrupted while the refresh is performed. A self-refresh operation is performed on a periodic basis when the DRAM 100 is in a sleep mode to prevent data loss.

The DRAM 100 includes a row decoder 104 for driving the wordlines and sense amplifiers and bitline access circuits 106 for transferring data into and out of the cells via the bitlines. Data path circuits include a data I/O circuit 114 that couples data between the sense amplifiers and bitline access circuits 106 and data input/output buffers 116. Addressing circuits include a row address predecoder 108 for generating a predecoded row address in response to a row address signal 130 and a column address decoder 110 for activating bitline access devices in response to a column address signal 132. The sense amplifiers and bitline access circuits 106 store and restore data in the cells of the memory array 102 by charging the capacitors of the cells.

In the particular example shown in FIG. 2, an internal voltage supply 112 generates voltages for operation of the DRAM 100 based on receipt of an external supply voltage Vdd and operates in response to an operation mode signal 128 and the sleep mode pump control signal 122. The sleep mode pump control signal 122 includes a word bootstrapping control signal 124 and a substrate bias control signal 126. Each of the word bootstrapping control signal 124 and the substrate bias control signal 126 provide an indication of the refresh time of the DRAM 100. The operation mode signal 128 provides an indication of whether the DRAM 100 is in the sleep mode or active mode. The internal voltage supply 112 includes a word bootstrapping voltage generator 118 and a substrate bias voltage generator 120 to which the word bootstrapping control signal 124 and the substrate bias control signal 126 are directed, respectively.

The word bootstrapping voltage generator 118 generates a positive word bootstrapping voltage Vpp in response to the operation mode of the DRAM 100 (e.g., the self-refresh/sleep mode or auto/active mode) as indicated in the operation mode signal 128. The word bootstrapping voltage Vpp is provided to memory circuitry, e.g., the row decoder 104. The word bootstrapping voltage Vpp can be used for driving wordlines of the DRAM 100. The word bootstrapping voltage generator 118 is a charge pump-based circuit and can have both an active voltage circuit for auto-refresh mode and normal read/write operations and a sleep mode pump circuit for self-refresh mode.

The substrate bias voltage generator 120 provides a negative substrate bias voltage Vbb that is provided to the memory circuitry, e.g., the cells of the memory array 102 to ensure stable cell-array operation. As with the word bootstrapping voltage generator 118, the substrate bias voltage generator 120 has also a charge pump circuit. The word bootstrapping voltage generator 118 and the substrate bias voltage generator 120 can be active at the same time in response to the operation mode signal 128. The word bootstrapping voltage generator 118 and the substrate bias voltage generator 120 perform boost operations in response to the word bootstrapping control signal 124 and the substrate bias control signal 126, respectively.

The boost required getting from Vdd to the word bootstrapping voltage Vpp or the substrate bias voltage Vbb changes with various characteristics of the DRAM 100. The refresh rate of the DRAM 100 is typically set to a time period that ensures that data will not be lost. However, this time period can be more frequent than necessary and it is desirable to reduce this frequency in order to reduce power consumption. With a shorter refresh time period, there is an increase in the internal power consumption of the DRAM 100, requiring more current as a result. In general, pump circuits are typically configured according to the worst refresh characteristics (i.e., the shortest time period) and thus provides more current than is required, resulting in greater power consumption. Temperature monitoring and variable refresh rate control circuits can change the refresh rate, if provided.

Figure 3:
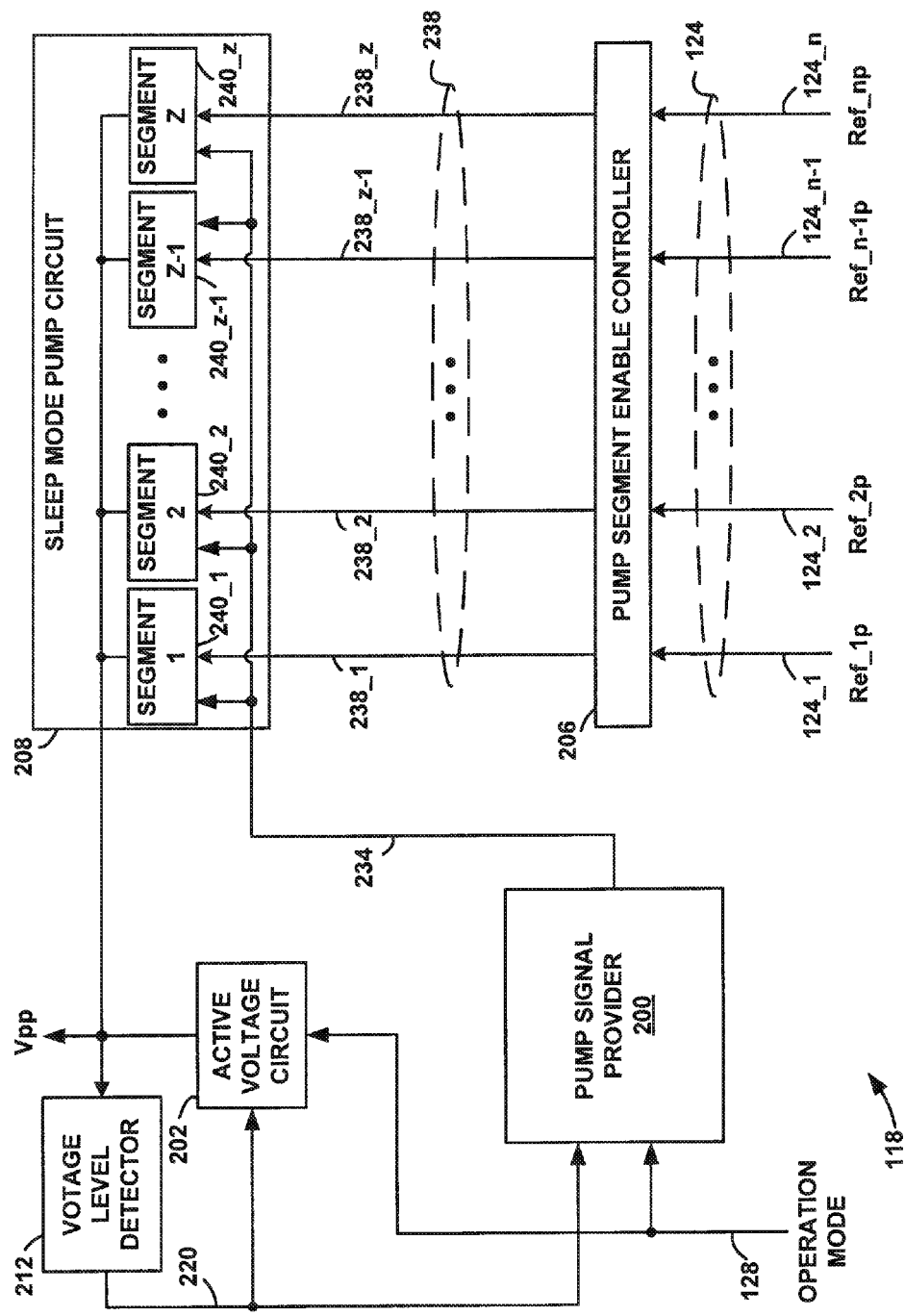
FIG. 3 is a block diagram illustrating details of an example of a word bootstrapping voltage generator shown in FIG. 2.

FIG. 3 shows an example of the word bootstrapping voltage generator 118 shown in FIG. 2. Referring to FIGS. 2 and 3, the word bootstrapping voltage generator 118 includes an active voltage circuit 202 and a voltage level detector 212. When the DRAM 100 is in the active mode and the sleep mode, the operation mode signal 128 is "high" and "low", respectively. In response to the "high" and "low" operation mode signal 128, the active voltage circuit 202 is activated and deactivates, respectively. In the active mode, the active voltage circuit 202 is activated and the word bootstrapping voltage Vpp is produced. If the word bootstrapping voltage Vpp is lower than a predetermined voltage level, the voltage level detector 212 will output a level detection signal 220 of logic "high". In response to the "high" level detection signal 220, the active voltage circuit 202 performs boost operation.

The word bootstrapping voltage generator 118 also performs boost operation when the DRAM 100 is in the sleep mode. Such a sleep mode boost operation is performed by similar circuitry as the active voltage circuit 202. The sleep mode boost operation circuitry includes a pump signal provider 200 and a sleep mode pump circuit 208. In the particular example shown in FIG. 3, the sleep mode pump circuit 208 has a plurality of pump segments. The sleep mode boost operation circuitry further includes a pump segment enable controller 206 for selectively activating the segments of the sleep mode pump circuit 208. The word bootstrapping voltage generator 118 receives information regarding the refresh time period that is being used for the DRAM 100 and uses this information to produce the word bootstrapping voltage Vpp according to the refresh time period when the DRAM 100 is in the sleep mode, The voltage level detector 212 determines the voltage level of the word bootstrapping voltage Vpp to provide a determination result. The voltage level detector 212 monitors the word bootstrapping voltage Vpp and produces the level detection signal 220 to indicate whether or not the word bootstrapping voltage Vpp is higher or lower a positive predetermined voltage Vdtp. The level detection signal 220 is used by the active voltage circuit 202 and the pump signal provider 200 either directly or indirectly to adjust the voltage output such that the word bootstrapping voltage Vpp remains approximately constant, regardless of whether or not the DRAM 100 is in the sleep mode or active mode.

Figure 4:
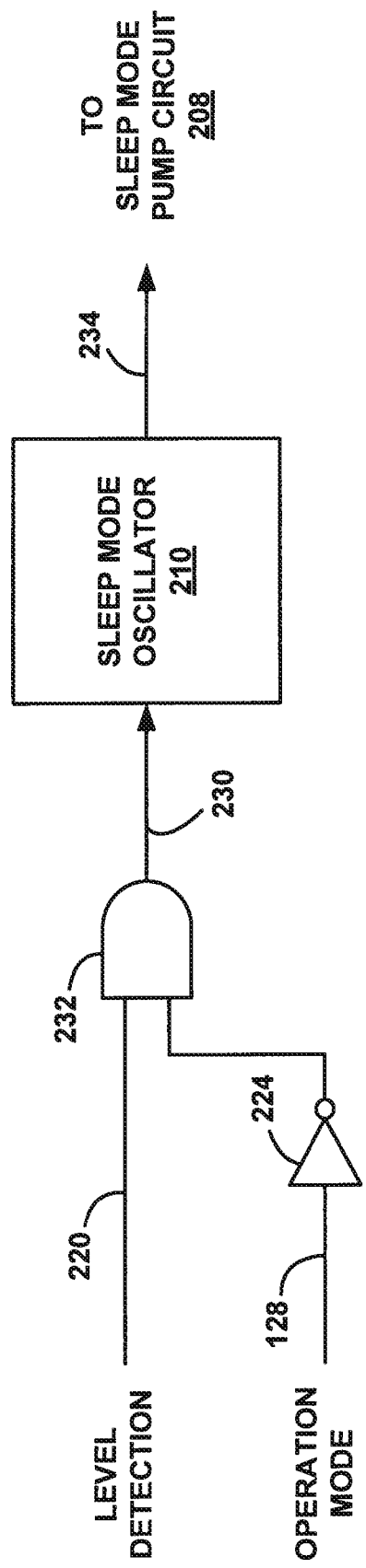
FIG. 4 is a block diagram illustrating an example of a pump signal provider shown in FIG. 3.

FIG. 4 shows an example of the pump signal provider 200 shown in FIG. 3. Referring to FIGS. 3 and 4, the operation mode signal 128 is inverted by an inverter 224 and its inverted output signal and the level detection signal 220 are fed to an AND gate 232. An output oscillation activation signal 230 from the AND gate 232 is fed to a sleep mode oscillator 210 which in turn provides a sleep mode oscillation signal 234 to the sleep mode pump circuit 208.

The level detection signal 220 is provided to the active voltage circuit 202 and the pump signal provider 200. When the word bootstrapping voltage Vpp is lower than a predetermined level Vdtp of the voltage level detector 212, the "high" level detection signal 220 is provided. With the "high" level detection signal 220, the active voltage circuit 202 or the pump signal provider 200 is activated in response to the operation mode signal 128. The voltage level detector 212 is in a feedback loop with both the active voltage circuit 202 and the sleep mode pump circuit 208 to achieve a constant voltage for the word bootstrapping voltage Vpp. When the word bootstrapping voltage Vpp is higher than the predetermined level Vdtp, the "low" level detection signal 220 is provided. The voltage level detector 212 is in a feedback loop with both the active pump circuit 202 and the sleep mode pump circuit 208 to maintain a constant voltage for the word bootstrapping voltage Vpp.

When the DRAM 100 enters the sleep mode, the operation mode signal 128 indicates that the DRAM 100 is in the sleep mode and the boost operation is to be performed if necessary. The boost operation for the self-refresh is performed by the sleep mode oscillator 210, the pump segment enable controller 206, the sleep mode pump circuit 208 and the voltage level detector 212.

The operation mode signal 128 is provided to the inverter 224 and its inverted output logic signal is combined with the level detection signal 220 by the AND gate 232 to activate the sleep mode oscillator 210. In the case of the sleep mode, in response to the level detection signal 220, the AND gate 232 provides the "high" oscillation activation signal 230 to the sleep mode oscillator 210 for the generation of the sleep mode oscillation signal 234.

The sleep mode pump circuit 208 pumps only at the edges of the sleep mode oscillation signal 234. Since the current requirements of the DRAM 100 in the sleep mode is lower than in the active mode, the frequency of the sleep mode oscillation signal 234 can be lower than the frequency of an oscillation signal of the active voltage circuit 202.

The sleep mode pump circuit 208 receives the sleep mode oscillation signal 234 from the sleep mode oscillator 210 and a pump enable signal 238 from the pump segment enable controller 206. The pump enable signal 238 indicates the amount of charge pump or current driven by the sleep mode pump circuit 208.

The pump segment enable controller 206 receives the word bootstrapping control signal 124 including a group of refresh time signals 124_1, 124_2, ..., 124_n–1 and 124_n, where n is an integer greater than one. The word bootstrapping control signal 124 contains information on the refresh time period for the DRAM 100. The refresh time period can be a preset time provided by the manufacturer or a time set by a user. Further, this refresh time can be static (e.g., the same value regardless of the operating conditions of the DRAM) or dynamic to adapt to changing operating conditions (e.g., temperature, etc.). Each of the refresh time signals 124_1, 124_2, . . . , 124_n−1 and 124_n represents a possible refresh time period. When the refresh time signal 124_1, 124_2, . . . , 124_n−1 or 124_n is "high", it indicates the refresh time used by the DRAM 100. The pump segment enable controller 206 uses this indication of the refresh time to determine how much voltage boost and current pumping the sleep mode pump circuit 208 provide. Since voltage and current requirements in the DRAM 100 will be greater with shorter refresh times, the shorter refresh times will result in greater current pumping. In response to the pump enable signal 238 from the pump segment enable controller 206, the sleep mode pump circuit 208 performs the voltage boost and current pumping. Table 1 shows examples of the refresh times Ref_1p, Ref_2p, . . . , Ref_n−1p and Ref_np represented by the refresh time signal 124_1, 124_2, . . . , 124_n−1 and 124_n, respectively.

TABLE 1

| Refresh Time | | | | |
|---|---|---|---|---|
| Ref_1p | Ref_2p | ... | Ref_n − 1p | Ref_np |
| 1 ms | 2 ms | ... | (n − 1) ms | n ms |
| (1 ms) × 1 | (1 ms) × 2 | ... | (1 ms) × (n − 1) | (1 ms) × n |

The sleep mode pump circuit 208 includes a plurality of pump circuit segments 240_1, 240_2, . . . , 240_z−1 and 240_z, z being an integer greater than one. Each of the pump circuit segments 240_1, 240_2, . . . , 240_z−1 and 240_z provides a small, predetermined amount of voltage boost and current pumping. The pump segment enable controller 206 determines which of the pump circuit segments 240_1, 240_2, . . . , 240_z−1 and 240_z are to be activated to perform the boost operation.

The group of pump segment enable signals 238_1, 238_2, . . . , 238_z−1 and 238_z are sent to the respective pump circuit segments 240_1, 240_2, . . . , 240_z−1 and 240_z. When the pump segment enable signals 238_1, 238_2, . . . , 238_z−1 and 238_z are high, the pump circuit segments 240_1, 240_2, . . . , 240_z−1 and 240_z receiving the high signals are activated. In the particular example shown in FIGS. 3 and 4, the voltage boost performed by each of the pump circuit segment 240_1, 240_2, . . . , 240_z−1 and 240_z is the same for every segment. The amount of voltage boost is limited by the voltage level detector 212. When the voltage boost is excessive (Vpp>Vdtp), the voltage level detector 212 outputs the "low" level detection signal 220 effectively stops the sleep mode pump circuit 208 from continuing to boost the voltage.

The current output by or flowing in each of the pump circuit segments 240_1, 240_2, . . . , 240_z−1 and 240_z has an additive effect. The activated pump circuit segments 240_1, 240_2, . . . , 240_z−1 and 240_z increase the current output by the sleep mode pump circuit 208. Since a greater amount of current is used when the DRAM 100 has faster refresh times, the pump segment enable controller 206 activates a greater number of the pump circuit segments 240_1, 240_2, . . . , 240_z−1 and 240_z.

Figure 5:
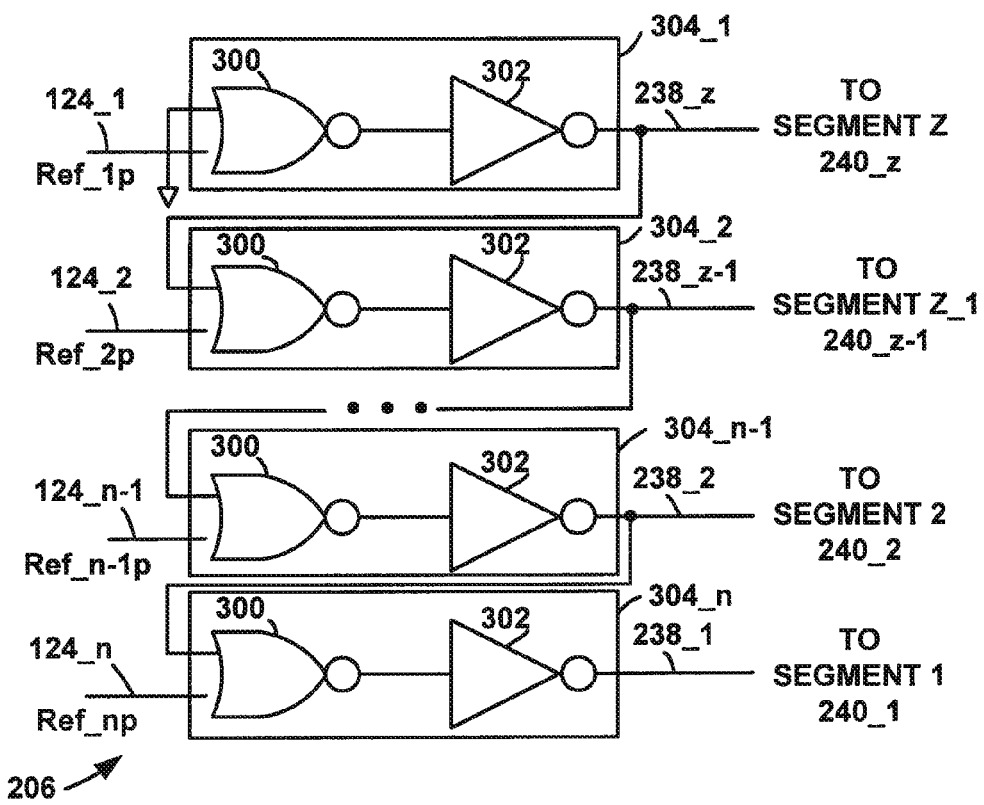
FIG. 5 is a block diagram illustrating an example of a pump segment enable controller shown in FIG. 3.

FIG. 5 shows an example of the pump segment enable controller 206 shown in FIG. 3. Referring to FIG. 5, the pump segment enable controller 206 includes a plurality (n) of OR logic circuits 304_1, 304_2, . . . , 304_n−1 and 304_n, n being an integer greater than one. Each of the OR logic circuits 304_1, 304_2, . . . , 304_n−1 and 304_n is formed by a series-connected NOR gate 300 and inverter 302.

The refresh time signals 124_1, 124_2, . . . , 124_n−1 and 124_n represent the refresh time of the DRAM 100. At a time only one of the refresh time signals 124_1, 124_2, . . . , 124_n−1 and 124_n is "high" and the others are "low". Each of the refresh time signals 124_1, 124_2, . . . , 124_n−1 and 124_n is provided as one input of the respective NOR gate 300. The other input of the NOR gate 300 in each of the OR logic circuits 304_2, . . . , 304_n−1 and 304_n is an output from the previous OR logic circuit 304_1, 304_2, . . . , and 304_n−1. The other input of the NOR gate 300 of the OR logic circuit 304_1 is pulled down (i.e., logic "low").

The outputs of the OR logic circuits 304_1, 304_2, . . . , 304_n−1 and 304_n produce the pump segment enable signals 238_z, 238_z−1, . . . , 238_2 and 238_1, respectively. Since the output of one of the OR logic circuits 304_1, 304_2, . . . , 304_n−2 and 304_n−1 is provided as an input of the next OR logic circuit 304_2, . . . , 304_n−1 and 304_n, if the shortest refresh time signal (in this case Ref_1p (=1 ms) represented by the signal 124_1) is high, all of the pump segment enable signals 238_1, 238_2, . . . , 238_z−1 and 238_z will be high, so that all of the pump circuit segments 240_1, 240_2, . . . , 240_z−1 and 240_z will be turned on to provide maximum current pumping. If the second shortest refresh time signal (in this case Ref_2p (=2 ms) represented by the signal 124_2) is high, every segment other than one is turned on. If the longest refresh time signal (in this case Ref_np (=n ms) represented by the signal 124_n) is high then only the first segment is turned on. Table 2 shows an example of how the pump circuit segments 240_1, 240_2, . . . , 240_z−1 and 240_z are activated according to the refresh time.

TABLE 2

| Refresh Time and Segment Activation | | | | |
|---|---|---|---|---|
| Refresh Time (ms) | Segment 1 240_1 | Segment 2 240_2 | ... | Segment Z − 1 240_z − 1 | Segment Z 240_z |
| 1 | ACT | ACT | ... | ACT | ACT |
| 2 | ACT | ACT | ... | ACT | NO-ACT |
| ... | ... | ... | ... | ... | ... |
| n − 1 | ACT | ACT | ... | NO-ACT | NO-ACT |
| n | ACT | NO-ACT | ... | NO-ACT | NO-ACT |

In Table 2, "ACT" and "NO-ACT" represent "activated" and "non-activated", respectively.

Figure 6:
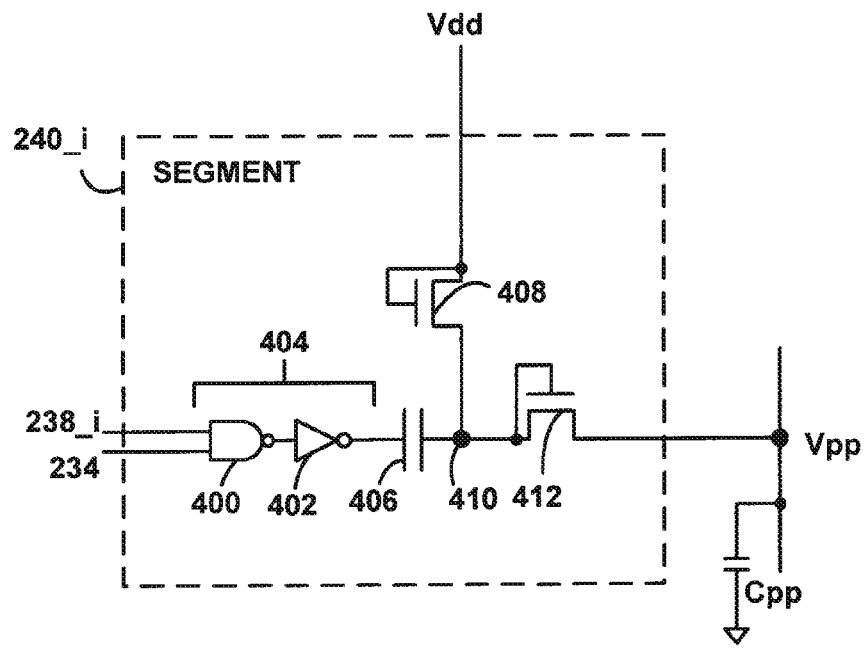
FIG. 6 illustrates an example of a segment of a sleep mode pump circuit shown for the word bootstrapping voltage generator in FIG. 3.

FIG. 6 shows an example of one segment of the sleep mode pump circuit 208 shown in FIG. 3. Referring to FIG. 6, a segment 240_i represents any one of the pump circuit segments 240_1, 240_2, . . . , 240_z−1 and 240_z. The pump circuit segment 240_i includes an AND logic circuit 404, a capacitor 406, a drain-gate connected clamp transistor 408 and a drain-gate connected drive transistor 412. The AND logic circuit 404 is formed by an NAND gate 400 and an inverter 402 connected thereto. The output of the AND logic circuit 404 is connected through the capacitor 406 to the clamp transistor 408 and the drive transistor 412. The NAND gate 400 receives the sleep mode oscillation signal 234 and the pump segment enable signal 238_i. The pump segment enable signal 238_i is a signal from the pump segment enable controller 206.

The capacitor 406 corresponds to the capacitive element CPE of FIG. 1. The memory circuitry receiving the word bootstrapping voltage Vpp has a capacitive element Cpp, which corresponds to the capacitive element LCP shown in FIG. 1. Such a capacitive element Cpp, therefore, shares the charge of the capacitor 406 and current can flow from the capacitor 406 to the memory circuitry.

Referring to FIGS. 2-6, in the particular example shown therein, each of the pump circuit segments 240_1, 240_2, ..., 240_z-1 and 240_z produces the same amount of voltage boost and current pumping, in response to the sleep mode oscillation signal 234. When the DRAM 100 is in the sleep mode (i.e., the operation mode signal 128 is high) and the word bootstrapping voltage Vpp is to be boosted (i.e., the level detection signal 220 is high), in response to the sleep mode oscillation signal 234, the pump circuit segment 240_i performs the pump function and the boosted word bootstrapping voltage Vpp is provided. During the sleep mode oscillation signal 234 is low, the capacitor 406 is charged by Vdd-Vthn through the clamp transistor 408 and then, during the sleep mode oscillation signal 234 is high, the charge voltage at a point, referenced by 410, is boosted by the voltage of the sleep mode oscillation signal 234. Vthn is an NMOS threshold voltage.

The drive transistor 412 is a one-direction driver that is open while the voltage at point 410 is positive. The drive transistor 412 is off, when the voltage at point 410 is falling. With the boost function performed by the segment 240_i, the word bootstrapping voltage Vpp slowly increases. The result is that the charges of all activated pump circuit segments are combined to produce the word bootstrapping voltage Vpp to achieve an increased boosted current.

In a configuration of the segment 240 shown in FIG. 6, every segment is the same, producing the same voltage and current. A person of skill in the art will understand that the segments can be configured to produce different currents.

Figure 7:
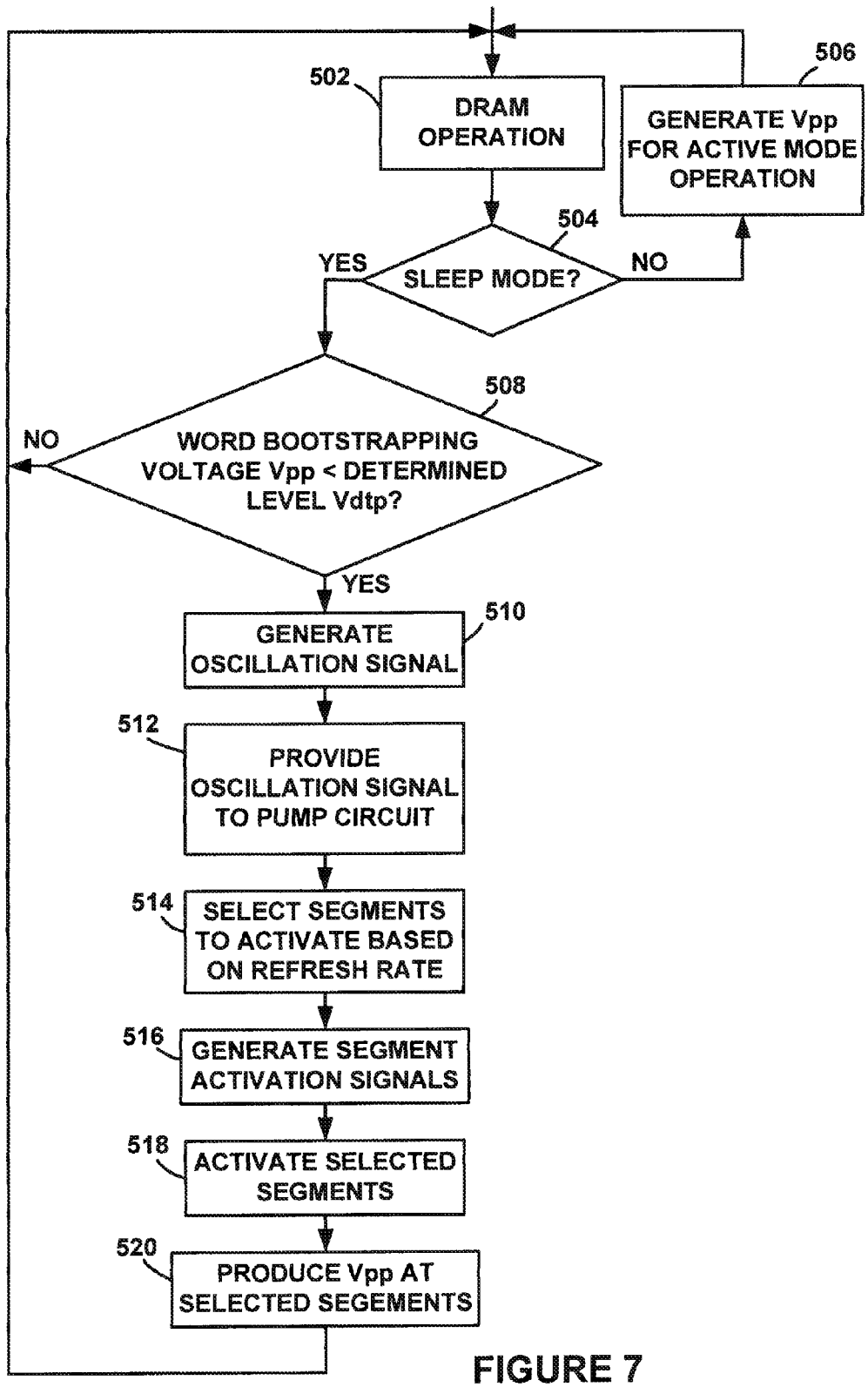
FIG. 7 is a flow chart of operations performed by the word bootstrapping voltage generator shown in FIG. 3.

FIG. 7 shows the operation of the word bootstrapping voltage generator of FIG. 3. Referring to FIGS. 2-6, the DRAM 100 operates (step 502) and the DRAM operation mode is determined whether it is the sleep mode (step 504) according to the operation mode signal 128. In the case of the "high" operation mode signal 128, the DRAM operation mode is the active mode (NO at step 504). Then, the active voltage circuit 202 is activated to generate the word bootstrapping voltage Vpp for the active mode operation (step 506).

In the "low" operation mode signal 128, the DRAM operation mode is the sleep mode (YES at step 504). Thereafter, the word bootstrapping voltage Vpp is compared to the predetermined level Vdtp to determine the former is lower than the latter (step 508). In the case where the word bootstrapping voltage Vpp is higher than the determined level Vdtp, the voltage level detector 212 provides the "low" level detection signal 220 (NO at step 508). Then, the DRAM operation is performed (step 502).

In the case where the word bootstrapping voltage Vpp is lower than the determined level Vdtp, the voltage level detector 212 provides the "high" level detection signal 220 (YES at step 508). The "high" level detection signal 220 and the "low" operation mode signal 128 result in the "high" oscillation activation signal 230 and the sleep mode oscillator 210 generates the sleep mode oscillation signal 234 (step 510). Then, the sleep mode oscillation signal 234 is provided to the sleep mode pump circuit 208 (step 512).

Segments of the sleep mode pump circuit 208 are selected for activation based on a refresh rate (step 514). In other words, if the refresh rate indicates frequent refresh operations then a greater number of segments will be activated due to the larger current used in the DRAM 100. Based on the selected segments, pump segment activation signals are generated (step 516). In response to the generated pump segment activation signals, the pump circuit segments are selected and the selected segments are activated (step 518).

The outputs from the selected segments are combined to produce the word bootstrapping voltage Vpp (step 520). The DRAM 100 is operated with the word bootstrapping voltage Vpp (step 502). In the sleep mode, the operations of steps 508-520 are repeated. If the word bootstrapping voltage Vpp becomes higher than the predetermined level Vdtp (NO at step 508), the voltage boost and current pumping are ceased.

Figure 8:
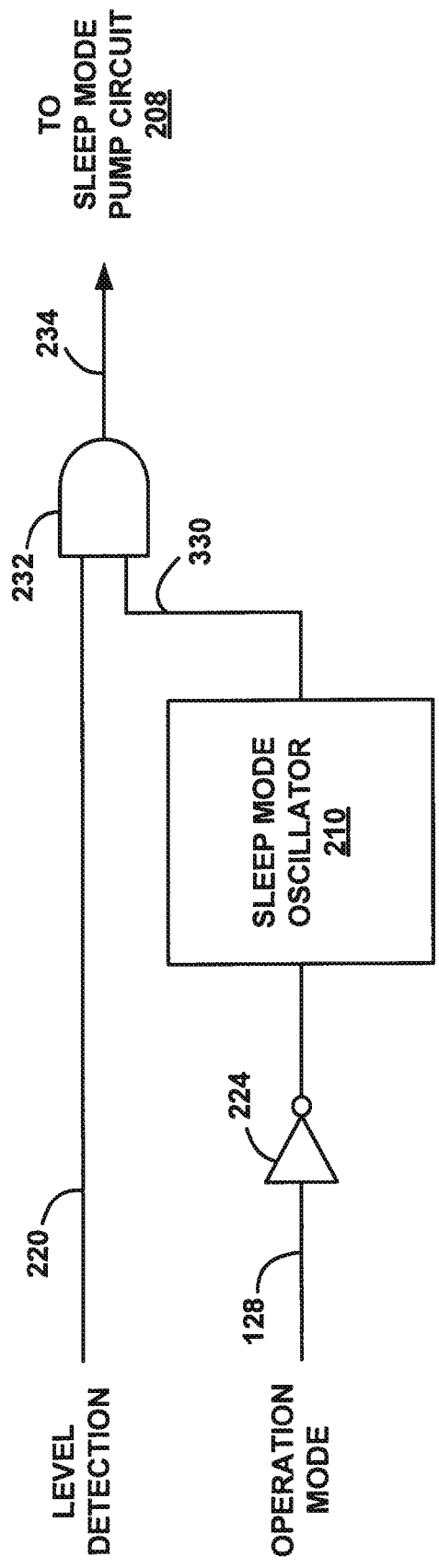
FIG. 8 is a block diagram illustrating another example of a pump signal provider shown in FIG. 3.
Figure 9:
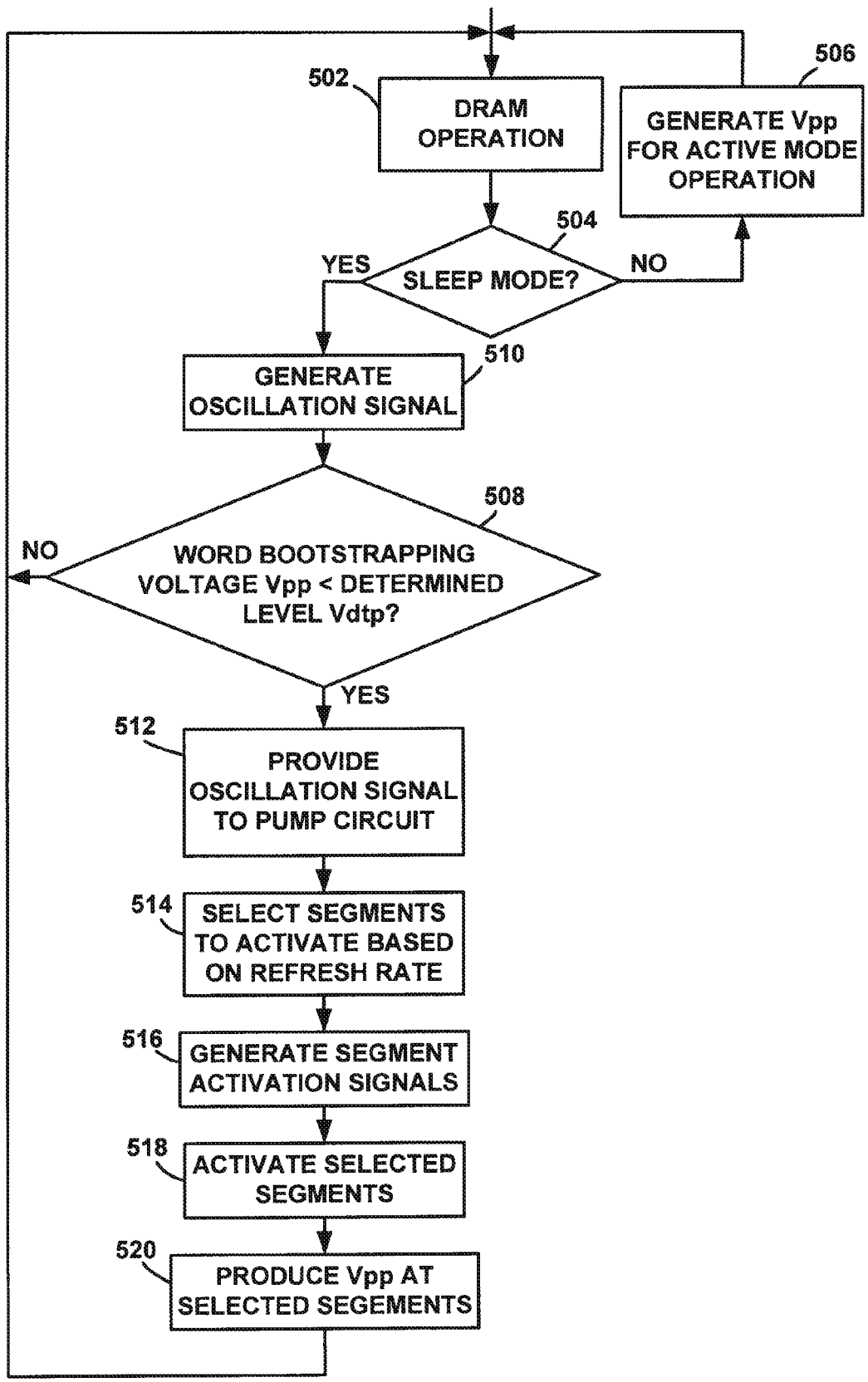
FIG. 9 is a flow chart of operations performed by the word bootstrapping voltage generator having the pump signal provider shown in FIG. 8.

FIG. 8 shows another example of the pump signal provider 200 shown in FIG. 3. The pump signal provider 200 shown in FIG. 8 is similar to that of FIG. 4. In the example illustrated in FIG. 8, the sleep mode oscillator 210 is activated by the operation mode signal 128 and an output oscillation signal 330 of the sleep mode oscillator 210 is fed to the AND gate 232. Operations performed by the DRAM implementing the pump signal provider of FIG. 8 are shown in FIG. 9. The operations shown in FIG. 9 are similar to those of FIG. 7. The operations conducted in steps 508 and 510 are reversed. In the operations of FIG. 9, when the DRAM operation mode is determined as the sleep mode (YES at step 504), then sleep mode oscillator 210 generates the oscillation signal 330 (step 510) and the, it is determined whether the word bootstrapping voltage Vpp is lower than the determined level Vdtp (step 508). Therefore, the oscillation signal is always produced, but only provided to the pump circuit, when the level detection signal 220 is high.

FIG. 10 shows another example of a pump signal provider shown in FIG. 3. In the example illustrated in FIG. 10, an oscillator 310 is activated by a power up signal and its oscillation output signal 340 is provided to the AND gate 232. The operation performed by the pump signal provider of FIG. 10 is similar to that of FIG. 8.

Figure 11:
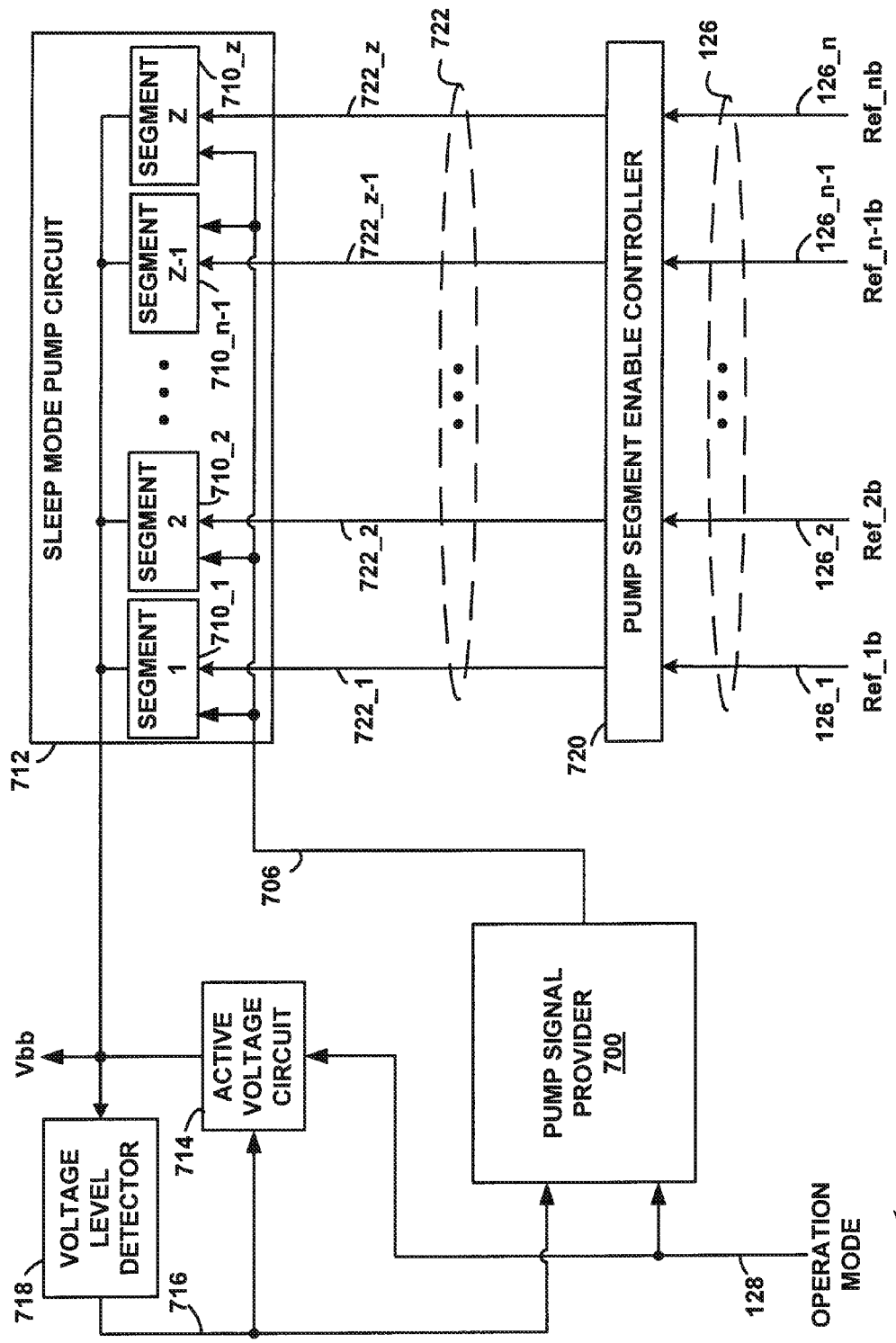
FIG. 11 is a block diagram illustrating details of an example of a substrate bias voltage generator shown in FIG. 2.

FIG. 11 shows an example of the substrate bias voltage generator 120 shown in FIG. 2. The configuration of the substrate bias voltage generator 120 is similar to that of the word bootstrapping voltage generator 118. The substrate bias voltage generator 120 functions in the same manner as that of the word bootstrapping voltage generator 118 to produce such a boosted voltage as the substrate bias voltage Vbb. The substrate bias voltage Vbb is a negative voltage.

Referring to FIGS. 2 and 11, similarly to the word bootstrapping voltage generator 118, the substrate bias voltage generator 120 includes an active voltage circuit 714 and a voltage level detector 718. In this particular example, the voltage level detector 718 determines whether the substrate bias voltage Vbb is higher or lower than a negative predetermined voltage Vdtn and outputs a level detection signal 716 as a determination result. In response to the "high" and "low" operation mode signal 128 in the active and sleep mode of the DRAM 100, the active voltage circuit 714 is activated and deactivated, respectively.

The substrate bias voltage generator 120 performs a sleep mode boost operation by a pump signal provider 700, a sleep mode pump circuit 712 and a pump segment enable controller 720. The sleep mode pump circuit 712 has a plurality of pump segments 710_1, 710_2, ..., 710_z-1 and 710_z that are selectively activated by the pump segment enable controller 720, where z is an integer greater than one. The substrate bias voltage generator 120 receives information regarding the refresh time period in the sleep mode and produces the substrate bias voltage Vbb according to the refresh time period. The configuration and operation of the pump segment enable controller 720 are the same as those of the pump segment enable controller 206 of FIGS. 3 and 5.

The voltage level detector 718 monitors the substrate bias voltage Vbb to produce the level detection signal 716. Since the substrate bias voltage Vbb is negative, the level detection signal 716 is "high" and "low" when the substrate bias voltage Vbb is higher and lower than the predetermined level Vdtn, respectively.

The pump signal provider 700 has the same circuitry as shown in FIG. 4. The pump signal provider 700 provides a sleep mode oscillation signal 706 to the sleep mode pump circuit 712 when the operation mode signal 128 is "low" and the level detection signal 716 is "high". The sleep mode oscillation signal 706 corresponds to the sleep mode oscillation signal 234 of FIG. 4.

FIG. 12 shows an example of the pump signal provider 700 shown in FIG. 11. The particular example shown in FIG. 12 has the same circuit as that of FIG. 4.

Referring to FIGS. 2, 11 and 12, the AND gate 232 receives the level detection signal 716 and an inverted signal of the operation mode signal 128 to activate the sleep mode oscillator 210 that provide the sleep mode oscillation signal to the sleep mode pump circuit 712. The pump segment enable controller 720 receives the substrate bias control signal 126 including refresh time signals 126_1, 126_2, ..., 126_n−1 and 126_n that represent possible refresh times for the DRAM, Ref_1b, Ref_2b, ..., Ref_n-1b and Ref_nb. The refresh times Ref_1b, Ref_2b, ..., Ref_n-1b and Ref_nb can be different from or the same as the Ref_1p, Ref_2p, ..., Ref_n-1p and Ref_np for the word bootstrapping voltage generator 118. The pump segment enable controller 720 uses this indication of the refresh time. The pump segment enable controller 720 provides a pump enable signal 722 including a plurality of pump segment enable signals 722_1, 722_2, ..., 722_z−1 and 722_z to activate the sleep mode pump circuit 712.

The sleep mode pump circuit 712 receives the sleep mode oscillation signal 706 from the pump signal provider 700 as well as the pump segment enable signals 722_1, 722_2, ..., 722_z−1 and 722_z. The pump segment enable controller 720 determines which of these segments 710_1, 710_2, ..., 710_z−1 and 710_z are to be activated to provide the amount of voltage boost and current pumping for self-refresh operation. The segments 710_1, 710_2, ..., 710_z−1 and 710_z are activated on the basis of the pump segment enable signals 722_1, 722_2, ..., 722_z−1 and 722_z.

When the substrate bias voltage Vbb goes lower than the negative predetermined level Vdtn, the "low" level detection signal 716 is provided to stop the sleep mode pump circuit 712 from continuing to boost the voltage. When the substrate bias voltage Vbb goes higher than the negative predetermined level Vdtn, the "high" level detection signal 716 is provided to perform the voltage boost operation. The current pumped by each of the segments 710_1, 710_2, ..., 710_z−1 and 710_z has an additive effect, so that the segments 710_1, 710_2, ..., 710_z−1 and 710_z can be activated to increase the current pumped by the sleep mode pump circuit 712.

Figure 13:
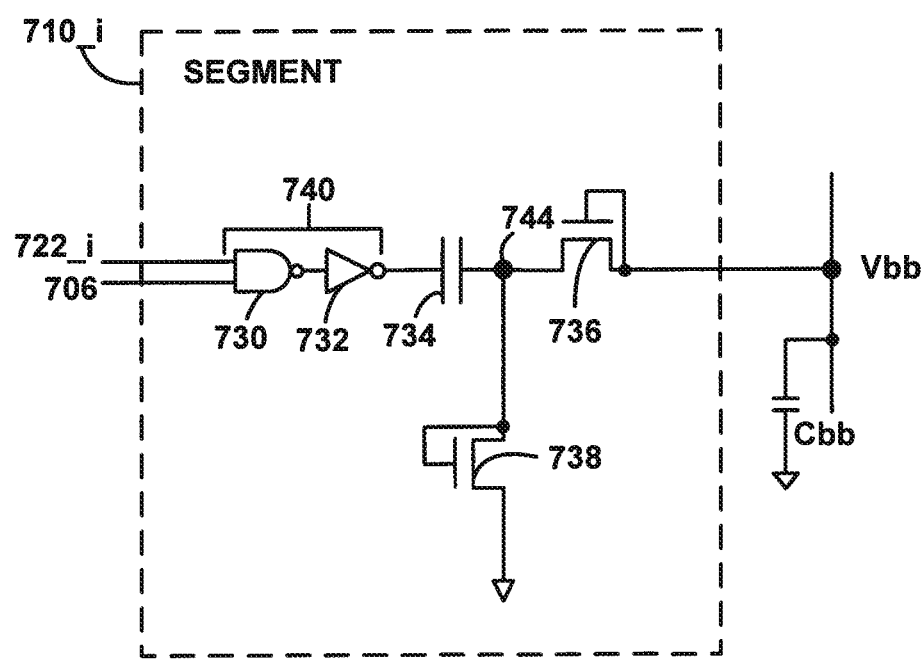
FIG. 13 illustrates an example of a segment of a sleep mode pump circuit for the substrate bias voltage generator shown in FIG. 12.

FIG. 13 shows an example of a segment of the sleep mode pump circuit 712 shown in FIG. 11. Referring to FIG. 13, a pump circuit segment 710_i represents any one of the pump circuit segments 710_1, 710_2, ..., 710_z−1 and 710_z shown in FIG. 11. The pump circuit segment 710_i includes an AND logic circuit 740, a capacitor 734, a drain-gate connected clamp transistor 738 and a drain-gate connected drive transistor 736. The AND logic circuit 740 is formed by a NAND gate 730 and an inverter 732 connected thereto. The pump circuit segment 710_i has a configuration similar to the segment 240_i for the word bootstrapping voltage generator 118 shown in FIG. 2. The clamp transistor 738 is connected to the ground. The drive transistor 736 is reversely biased due to the negative voltage produced by the segment 710_i. The output of the AND logic circuit 740 is connected through the capacitor 734 to the clamp transistor 738 and the drive transistor 736. The NAND gate 740 receives the sleep mode oscillation signal 706 and the pump segment enable signal 722_i from the pump segment enable controller 720.

Referring to FIGS. 11 and 13, when the DRAM 100 is in the sleep mode and "high" pump segment enable signal 722_i, during the sleep mode oscillation signal 706 is high, the capacitor 734 is charged through the clamp transistor 738. Then, during the sleep mode oscillation signal 706 is low, the charge voltage at a point, referenced by 744, is boosted. Thus, the substrate bias voltage Vbb is provided to the memory circuitry, which has a capacitive element Cbb. The capacitive element Cbb corresponds to the capacitive element LCP shown in FIG. 1 and shares the charge with the capacitor 734 through the drive transistor 736. Therefore, the charges of all activated pump circuit segments are combined to produce the negative substrate bias voltage Vbb The pump circuit segment 710_i shown in FIG. 13 illustrates a configuration in which every segment is the same, producing the same voltage and current. A person of skill in the art will understand that the segments can be configured that only a single segment is activated or multiple segments is activated.

Figure 14:
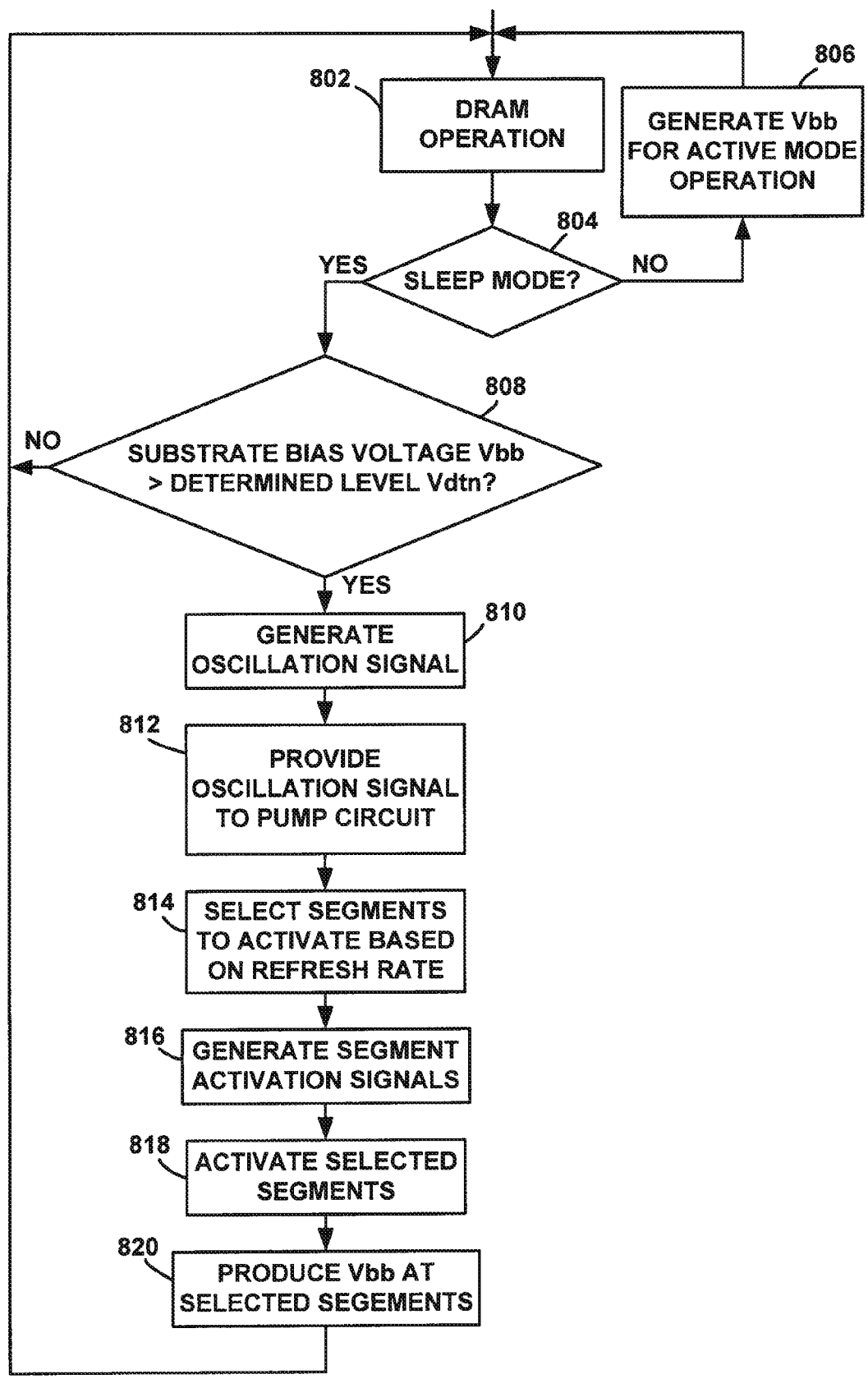
FIG. 14 is a flow chart of operations performed by the substrate bias voltage generator shown in FIG. 11.

FIG. 14 shows operations of the substrate bias voltage generator of FIG. 11. Referring to FIGS. 2 and 11-14, the DRAM 100 operates (step 802) and the DRAM operation mode is determined whether it is the sleep mode (step 804) according to the operation mode signal 128. In the case of the "high" operation mode signal 128, the DRAM operation mode is the active mode (NO at step 804). Then, the active voltage circuit 714 is activated to generate the word bootstrapping voltage Vbb for the active mode operation (step 806).

In the "low" operation mode signal 128, the DRAM operation mode is the sleep mode (YES at step 804). Thereafter, the substrate bias voltage Vbb is compared to the negative predetermined level Vdtn to determine the former is higher than the latter (step 808). In the case where the substrate bias voltage Vbb is lower than the determined level Vdtn, the voltage level detector 718 provides the "low" level detection signal 716 (NO at step 808). Then, the DRAM operation is performed (step 802).

In the case where the substrate bias voltage Vbb is higher than the determined level Vdtn, the voltage level detector 718 provides the "high" level detection signal 716 (YES step 808). The "high" level detection signal 716 and the "low" operation mode signal 128 result in the "high" oscillation activation signal 230 and the sleep mode oscillator 210 generates the sleep mode oscillation signal 706 (step 810). The sleep mode oscillation signal 706 is provided to the sleep mode pump circuit 712 (step 812). Based on a refresh rate, the pump segment activation signals are generated (step 816). In response to the pump segment activation signals, the segments of the sleep mode pump circuit 712 are selected for activation (step 818). Then, the substrate bias voltage Vbb is produced by the selected segments (step 820). The outputs from the selected segments are combined to produce the substrate bias voltage Vbb. The DRAM 100 is operated with the substrate bias voltage Vbb (step 802). In the sleep mode, the operations of steps 808-820 are repeated. If the substrate bias voltage Vbb goes lower than the predetermined level Vdtn (NO at step 808), pumping is ceased.

The pump signal provider 700 can be formed by the same pump signal provider 200 of FIG. 8, as shown in FIG. 15.

Figure 16:
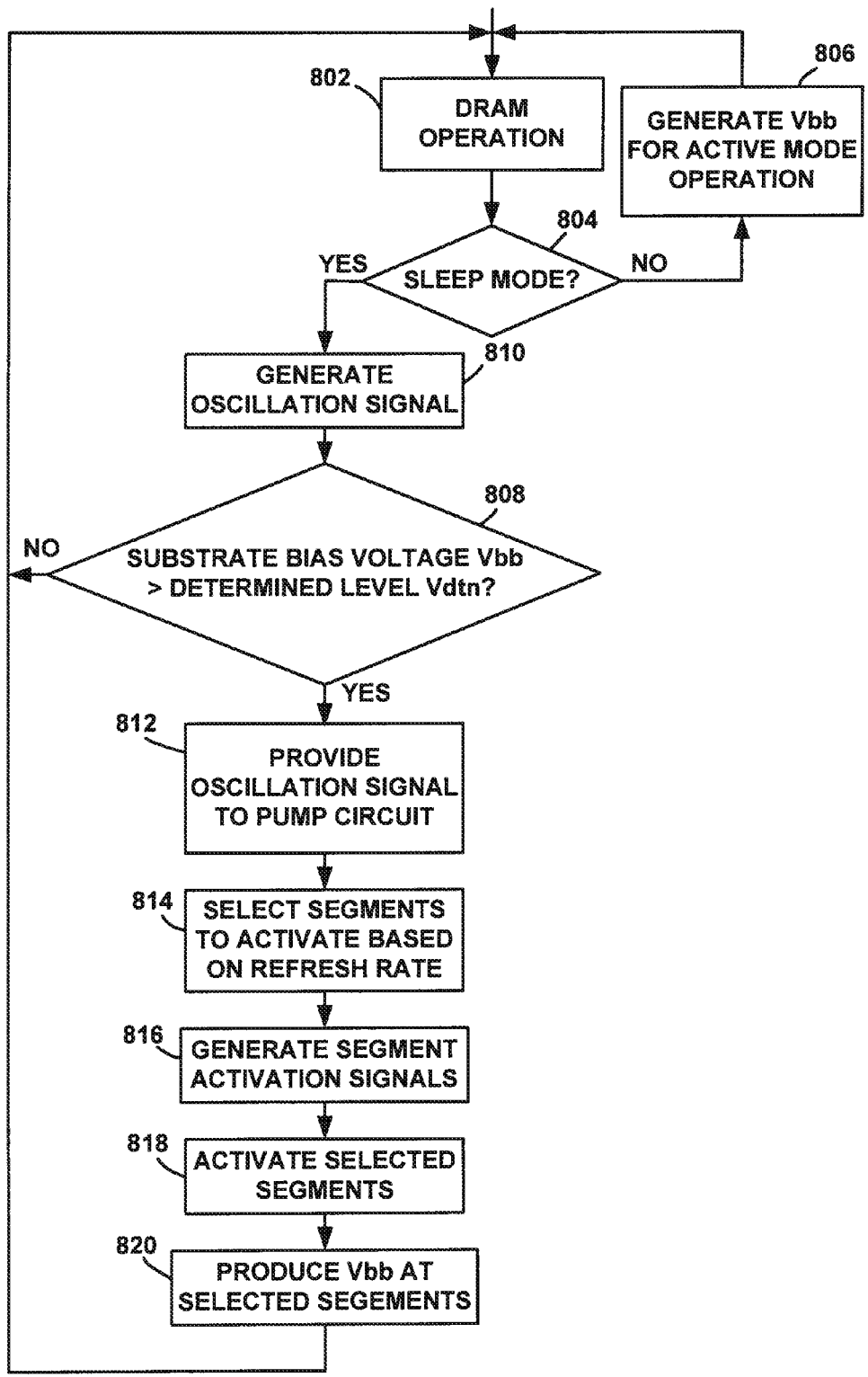
FIG. 16 is a flow chart of operations performed by the substrate voltage generator having the pump signal provider shown in FIG. 15.

In the substrate bias voltage generator 120 having the pump signal provider as shown in FIG. 15, the sleep mode oscillator 210 is activated by the operation mode signal 128 and the output oscillation signal 330 of the sleep mode oscillator 210 is fed to the AND gate 232. The operations performed by the DRAM implementing the pump signal provider shown in FIG. 15 are shown in FIG. 16. The operations of FIG. 16 are similar to those of FIG. 14. Steps 808 and 810 are reversed. In the operations of FIG. 16, when the DRAM operation mode is determined as the sleep mode (YES at step 804), the sleep mode oscillator 210 generates the oscillation signal 330 (step 810) and then, it is determined whether the substrate bias voltage Vbb is higher than the negative determined level Vdtn (step 808). Therefore, the oscillation signal is always produced in response to the operation mode signal 128, but only provided to the sleep mode pump circuit 712, when the level detection signal 220 is high.

FIG. 17 shows another example of the pump signal provider 700 shown in FIG. 11. The circuit and operation of the pump signal provider shown in FIG. 17 are similar to those of FIG. 10.

In the DRAM 100 shown in FIG. 2, each of the word bootstrapping control signal 124 and the substrate bias control signal 126 provides individually an indication of the refresh time for charge pump operation. The information on the charge pump operation can be applied to both of the word bootstrapping voltage generator and the substrate bias voltage generator of the internal voltage supply.

Figure 18:
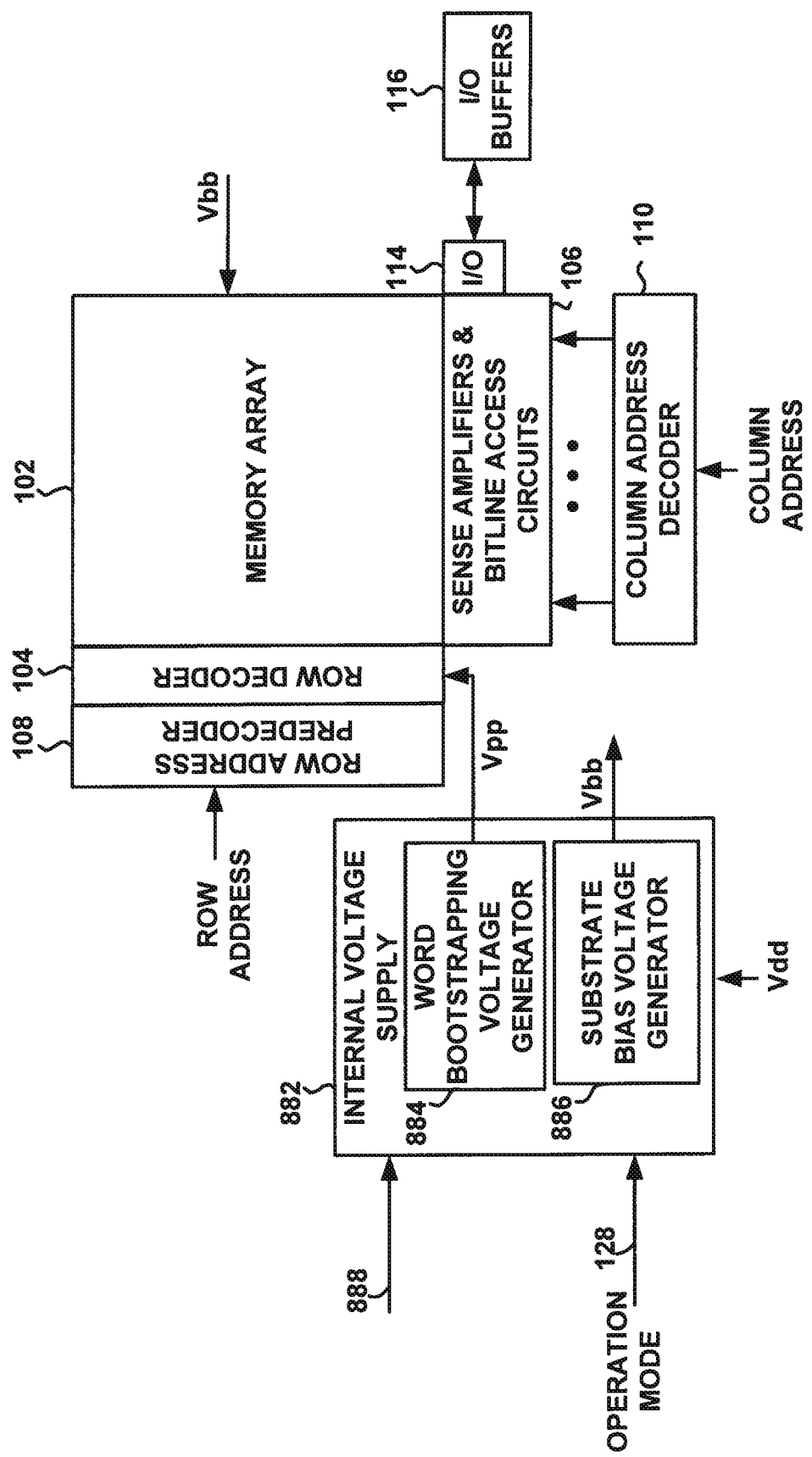
FIG. 18 is a block diagram illustrating another example of a dynamic random access memory (DRAM) according to another embodiment of the present invention.

FIG. 18 shows another dynamic random access memory (DRAM) according to another embodiment of the present invention. A DRAM 880 shown in FIG. 18 is similar in configuration and functions to the DRAM 100 shown in FIG. 2. The sleep mode pump control signal contains only a single signal 888 and does not have separate component signals for a word bootstrapping voltage generator 884 and a substrate bias voltage generator 886 of an internal voltage supply 882.

Figure 19:
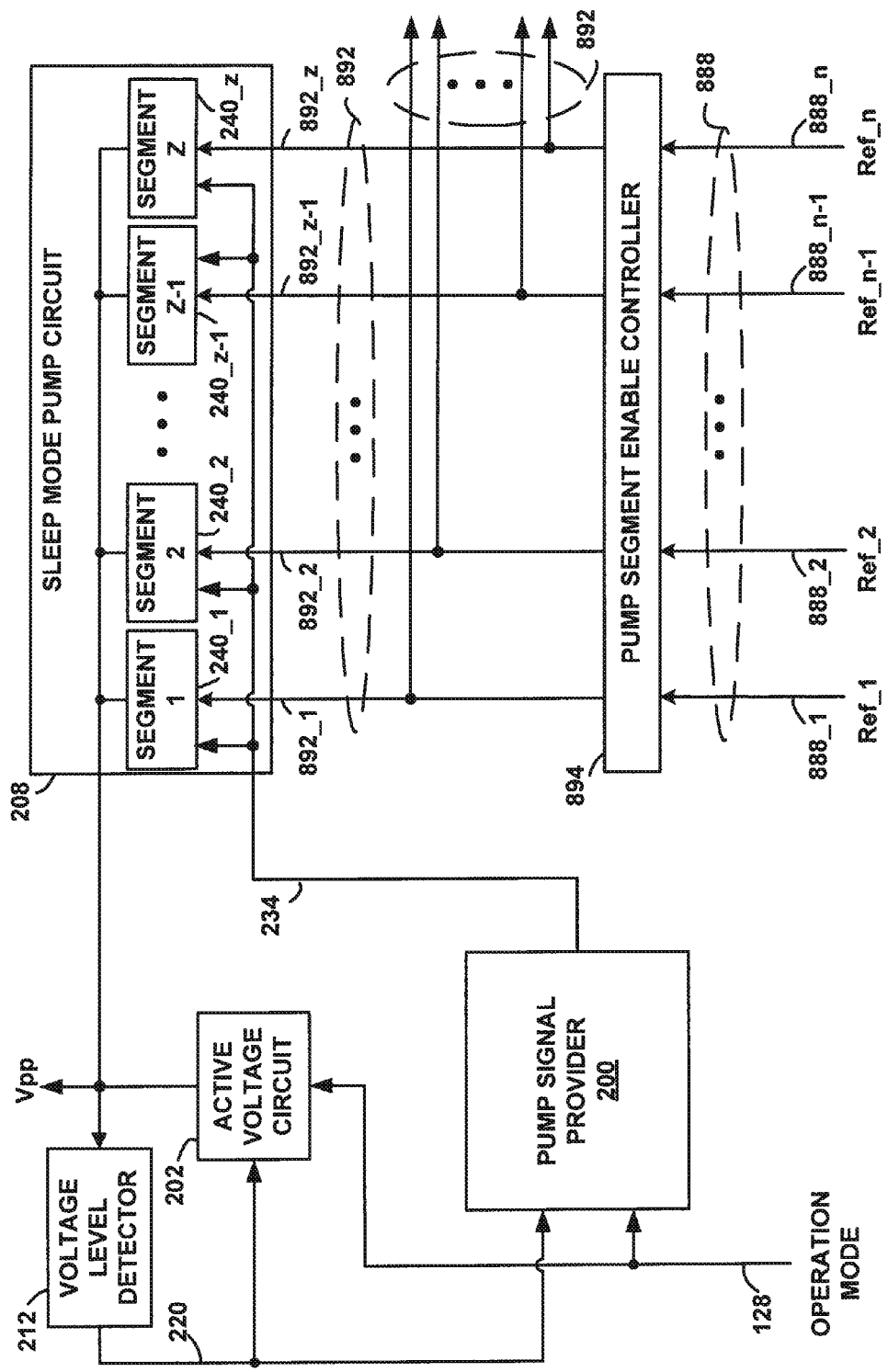
FIG. 19 is a block diagram illustrating details of an example of a word bootstrapping voltage generator shown in FIG. 18.

FIG. 19 shows an example of the word bootstrapping voltage generator 884 for use in the DRAM 880 of FIG. 18. The word bootstrapping voltage generator 884 has the same configuration and functions as the word bootstrapping voltage generator 118 of FIG. 3 with the exception of a pump segment enable controller 894. The pump segment enable controller 894 has the same configuration as the pump segment enable controller 206 of FIG. 3 and receives the sleep mode control signal 888 fed to the internal voltage supply 882. The sleep mode control signal 888 includes a plurality of refresh time signal $888\_1$, $888\_2$, ..., $888\_n-1$ and $888\_n$ that specify the refresh time period for the DRAM 880, n being an integer greater than one.

The pump segment enable controller 894 outputs pump segment signals $892\_1$, $892\_2$, ..., $892\_z-1$ and $892\_z$ for activating segments of the sleep mode pump circuit 208 in a manner similar to the pump segment enable controller of the previous embodiments. However, the pump segment signals $892\_1$, $892\_2$, ..., $892\_z-1$ and $892\_z$ are also provided to the substrate bias voltage generator 886. That is, there is only a single pump segment enable controller 894 for both the word bootstrapping voltage generator 884 and the substrate bias voltage generator 886.

Figure 20:
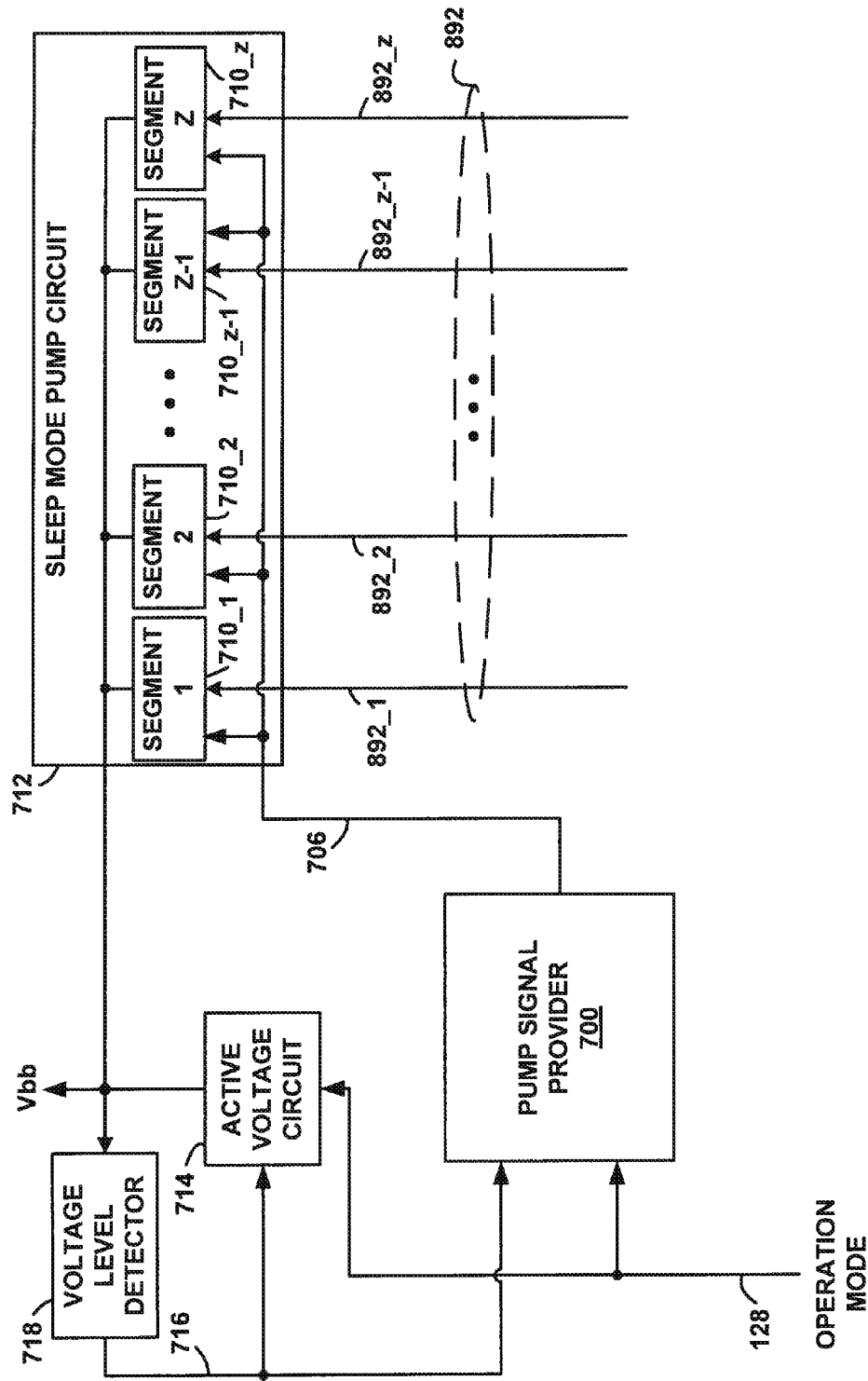
FIG. 20 is a block diagram illustrating an example of a substrate bias voltage generator shown in FIG. 18.

FIG. 20 shows an example of the substrate bias voltage generator 886 for use in the DRAM 880 of FIG. 18. The substrate bias voltage generator 886 has a similar configuration and functions as the substrate bias voltage generator 120 of FIG. 11 but without the pump segment enable controller. The substrate bias voltage generator 886 receives pump segment signals 892 from the pump segment enable controller 894 of the word bootstrapping voltage generator 884.

While FIG. 19 illustrates the pump segment enable controller 894 as part of the word bootstrapping voltage generator 884, it will be understood by a person of skill in the art that the pump segment enable controller 894 can alternatively be part of the substrate bias voltage generator 886 or be a separate component in the internal voltage supply 882.

The refresh time signal $888\_1$, $888\_2$, ..., $888\_n-1$ and $888\_n$ represent the refresh times $Ref\_1$, $Ref\_2$, ..., $Ref\_n-1$ and $Ref\_n$, respectively, which are used for voltage boost and current pumping in both of the word bootstrapping voltage generator 884 and the substrate bias voltage generator 886. The voltage boost and current pumping performed by the word bootstrapping voltage generator 884 and the substrate bias voltage generator 886 are similar to those of the word bootstrapping voltage generator 118 and the substrate bias voltage generator 120 shown in FIG. 2.

The embodiments above describe certain configurations where high and low values for various signals have certain meanings. It will be understood by one skilled in the art that these assigned meanings may be reversed and the resulting configuration changes necessary for proper functioning of the various components.

In the above described embodiments, the operation has been described based on positive "high" signals for the purpose of simplicity. The circuits may also be designed to perform the operation based on "low" active signals, in accordance with design preferences. It will be apparent to those of ordinary skill in the art that the polarity of the transistors can be changed and the operation voltages of the different polarity can be provided to the transistors of the different polarity.

In the embodiments described above, the device elements and circuits are connected to each other as shown in the figures for the sake of simplicity. In practical applications these devices, elements circuits, etc., may be connected directly to each other or indirectly through other devices elements, circuits, etc. Thus, in an actual configuration of semiconductor ICs, the elements, circuits and devices are coupled either directly or indirectly with each other.

It is apparent to one skilled in the art that numerous modifications and departures from the specific embodiments described herein may be made without departing from the spirit and scope of the invention.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A memory device comprising:
   a plurality of storage cells for storing data;
   a plurality of selectively activatable charge pumps for providing a boosted voltage for operation of the memory device; and
   a controller for selectively activating the plurality of charge pumps,
   the memory device being operable in a plurality of modes including an auto-refresh mode and a self-refresh mode, each mode being characterized by the activation of a different number of the plurality of charge pumps.

2. The memory device of claim 1, wherein:
   the memory device is a dynamic random access memory (DRAM) memory device; and
   the plurality of storage cells are a plurality of DRAM storage cells.

3. The memory device of claim 2, wherein:
   the auto-refresh mode provides that the DRAM storage cells are refreshed at an active mode refresh rate; and the self-refresh mode provides that the DRAM storage cells are refreshed at a reduced-power mode refresh rate slower than the active mode refresh rate.

4. The memory device of claim 3, wherein:
the active mode refresh rate corresponds to a rate of an auto-refresh operation during the active mode; and
each reduced-power mode refresh rate corresponds to a rate of a self-refresh operation during the corresponding reduced-power mode.

5. The memory device of claim 4, wherein the controller selects a mode of operation of the memory device based on a current refresh rate of the DRAM storage cells.

6. The memory device of claim 1, wherein the controller selectively activates the plurality of charge pumps by outputting an enable signal to each of the plurality of charge pumps.

7. The memory device of claim 1, wherein each of the plurality of modes corresponds to one of a plurality of refresh time periods.

8. The memory device of claim 1, wherein each of the plurality of charge pumps provides an equal amount of voltage boost when activated.

9. A method of operating a memory device, comprising:
determining whether the memory is operating in an auto-refresh mode or a self-refresh mode;
if the memory is operating in a self-refresh mode:
selecting a number of segments of a pump circuit based on a required current of the memory device; and
activating the selected segments;
wherein the memory device is a dynamic random access memory (DRAM) device, and the method further includes
determining the required current of the memory device based on a refresh rate of the memory device.

10. A method of operating a memory device, comprising:
determining whether the memory is operating in an auto-refresh mode or a self-refresh mode;
if the memory is operating in a self-refresh mode:
selecting a number of segments of a pump circuit based on a required current of the memory device; and
activating the selected segments;
combining the outputs of the selected segments to produce an output voltage; and
deactivating the pump circuit when an operating voltage of the memory device is higher than a predetermined voltage level.

* * * * *